United States Patent
Asai

(10) Patent No.: US 11,011,684 B2
(45) Date of Patent: *May 18, 2021

(54) LIGHT EMITTING DEVICE

(71) Applicant: NICHIA CORPORATION, Anan (JP)

(72) Inventor: Kenji Asai, Naruto (JP)

(73) Assignee: NICHIA CORPORATION, Anan (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/732,625

(22) Filed: Jan. 2, 2020

(65) Prior Publication Data

US 2020/0135987 A1 Apr. 30, 2020

Related U.S. Application Data

(60) Continuation of application No. 16/167,471, filed on Oct. 22, 2018, now Pat. No. 10,559,725, which is a
(Continued)

(30) Foreign Application Priority Data

May 26, 2016 (JP) .................................. 2016-104853
May 9, 2017 (JP) .................................. 2017-092899

(51) Int. Cl.
*H01L 33/50* (2010.01)
*H01L 33/48* (2010.01)
(Continued)

(52) U.S. Cl.
CPC ........ *H01L 33/504* (2013.01); *C09K 11/0883* (2013.01); *C09K 11/7707* (2013.01);
(Continued)

(58) Field of Classification Search
CPC ............ C09K 11/0883; C09K 11/7707; C09K 11/7721; C09K 11/7734; C09K 11/7739;
(Continued)

(56) References Cited

U.S. PATENT DOCUMENTS 8,710,532 B2 * 4/2014 Yamakawa .......... C09K 11/675
257/98
8,884,512 B2 * 11/2014 Yamakawa ........ C09K 11/7734
313/503
(Continued)

FOREIGN PATENT DOCUMENTS

JP 2003535477 A 11/2003
JP 2008034188 A 2/2008
(Continued)

*Primary Examiner* — Mohammed Shamsuzzaman
(74) *Attorney, Agent, or Firm* — Hunton Andrews Kurth LLP

(57) ABSTRACT

A light emitting device includes a light emitting element having a peak emission wavelength of 410 nm to 440 nm and a phosphor member. The phosphor member includes a first phosphor having a peak emission wavelength of 430 nm to 500 nm and containing an alkaline-earth phosphate, a second phosphor having a peak emission wavelength of 440 nm to 550 nm and containing at least one of an alkaline-earth aluminate and a silicate containing Ca, Mg, and Cl, a third phosphor having a peak emission wavelength of 500 nm to 600 nm and containing a rare-earth aluminate, a fourth phosphor having a peak emission wavelength of 610 nm to 650 nm and containing a silicon nitride containing Al and at least one of Sr and Ca, and a fifth phosphor having a peak emission wavelength of 650 nm to 670 nm and containing a fluorogermanate.

20 Claims, 5 Drawing Sheets

Related U.S. Application Data division of application No. 15/605,197, filed on May 25, 2017, now Pat. No. 10,141,484.

(51) Int. Cl.
*C09K 11/08* (2006.01)
*C09K 11/77* (2006.01)
*H01L 33/52* (2010.01)

(52) U.S. Cl.
CPC ...... *C09K 11/7721* (2013.01); *C09K 11/7734* (2013.01); *C09K 11/7739* (2013.01); *H01L 33/507* (2013.01); *H01L 33/486* (2013.01); *H01L 33/52* (2013.01)

(58) Field of Classification Search
CPC ... H01L 33/486; H01L 33/504; H01L 33/507; H01L 33/52
See application file for complete search history.

(56) References Cited

U.S. PATENT DOCUMENTS

| | | | | |
|---|---|---|---|---|
| 9,818,914 B2* | 11/2017 | Horie | | H01L 33/28 |
| 2007/0205712 A1 | 9/2007 | Radkov et al. | | |
| 2007/0223219 A1* | 9/2007 | Medendorp, Jr. | .. | C09K 11/7734 362/231 |
| 2008/0116786 A1* | 5/2008 | Wang | | C09K 11/0883 313/503 |
| 2009/0066230 A1* | 3/2009 | Hirosaki | | C01B 21/0823 313/504 |
| 2009/0072255 A1 | 3/2009 | Takahashi et al. | | |
| 2009/0140630 A1* | 6/2009 | Kijima | | C09K 11/7774 313/498 |
| 2011/0182072 A1* | 7/2011 | Shimizu | | C09K 11/7739 362/293 |
| 2012/0267999 A1* | 10/2012 | Sakuta | | C09K 11/7739 313/503 |
| 2013/0082289 A1 | 4/2013 | Sakuta et al. | | |
| 2013/0257266 A1* | 10/2013 | Ishizaki | | H01L 33/504 313/503 |
| 2013/0264937 A1 | 10/2013 | Sakuta et al. | | |
| 2013/0313516 A1 | 11/2013 | David et al. | | |
| 2014/0183578 A1* | 7/2014 | Horie | | H01L 33/28 257/89 |
| 2014/0217417 A1* | 8/2014 | Horie | | H01L 33/50 257/76 |
| 2014/0362885 A1* | 12/2014 | Sakuta | | H01L 33/50 372/44.01 |
| 2015/0349213 A1 | 12/2015 | Hosokawa et al. | | |
| 2016/0312118 A1* | 10/2016 | Fiedler | | H01L 27/322 |

FOREIGN PATENT DOCUMENTS

| | | |
|---|---|---|
| JP | 2008050379 A | 3/2008 |
| JP | 2009289957 A | 12/2009 |
| JP | 2012104814 A | 5/2012 |
| JP | 2013243129 A | 12/2013 |
| JP | 2015067754 A | 4/2015 |
| JP | 2016111190 A | 6/2016 |
| WO | 0193341 A1 | 12/2001 |

* cited by examiner

LIGHT EMITTING DEVICE

CROSS-REFERENCE TO RELATED PATENT APPLICATION

This is a continuation application of U.S. patent application Ser. No. 16/167,471, filed Oct. 22, 2018, which is a divisional of U.S. patent application Ser. No. 15/605,197, filed May 25, 2017 and claims benefit of Japanese Patent Application No. 2016-104853, filed on May 26, 2016 and Japanese Patent Application No. 2017-092899, filed on May 9, 2017, the entire disclosures of which are incorporated herein by reference.

BACKGROUND

Technical Field

The present disclosure relates to a light emitting device.

Related Art

Light emitting devices configured to emit white light may employ a combination of a light emitting diode (hereinafter may be referred to as an "LED") configured to emit blue light and a phosphor to emit yellow light. Such light emitting devices are configured to emit white light that is a mixture of blue light emitted by blue LEDs and yellow light emitted by phosphors that emit yellow light upon being excited by the blue light. Such light emitting devices provide high radiant intensity and high luminous efficiency in a visible light region, but sufficient radiant intensity in a blue-green region and a red region may not be obtained. For this reason, further improvement in visual perception in color of an irradiated object (hereinafter may be referred to as "color rendering properties") is desirable.

Evaluation of color rendering index of light sources is specified by JIS Z8726, in which, samples of colors of predetermined reflectance (R1 to R15) are measured by a test light and a reference light and the difference in color $\Delta E_i$ (i is an integer of 1 to 15) of each color is computed, then, the special color rendering index (Ri) is calculated. The color rendering index Ri (i is an integer of 1-15) has a maximum value of 100. That is, the smaller the difference in chromaticity between the sample light source and the reference light source of corresponding color temperature, the more the color rendering index approaches 100. Of the color rendering indices, an average of R1 to R8 is called average color rendering index Ra (hereinafter may be referred to as "Ra"), and R9-R15 are called "special color rendering indices". Of the special color rendering indices are each an evaluation index for red R9, yellow R10, green R11, blue R12, Caucasian skin color R13, tree leave green R14, and Asian skin color R15.

In order to improve color rendering properties of a light source, a light emitting device employing an LED to emit blue light and two types of phosphors to emit green to yellow light, for example, a chlorosilicate phosphor and a garnet-type phosphor having Y or Tb has been proposed, for example, in Published Japanese Translation of PCT International Application No. 2003-535477. In order to further improve color rendering properties of a light source, a light emitting device further employing a phosphor to emit red light in addition to phosphors to emit green to yellow light has been proposed, for example, in Japanese Unexamined Patent Application Publication No. 2008-034188.

SUMMARY

A light emitting device includes a light emitting element having a peak emission wavelength in a range of 410 nm to 440 nm and a phosphor member. The phosphor member includes a first phosphor having a peak emission wavelength in a range of 430 nm to 500 nm and containing an alkaline-earth phosphate that has Cl in the composition and activated with Eu, a second phosphor having a peak emission wavelength in a range of 440 nm to 550 nm and containing at least one of an alkaline-earth aluminate activated with Eu and a silicate that has Ca, Mg, and Cl in the composition and activated with Eu, a third phosphor having a peak emission wavelength in a range of 500 nm to 600 nm and containing a rare-earth aluminate activated with Ce, a fourth phosphor having a peak emission wavelength in a range of 610 nm to 650 nm and containing a silicon nitride that has Al and at least one of Sr and Ca in the composition and activated with Eu, and a fifth phosphor having a peak emission wavelength in a range of 650 nm to 670 nm and containing a fluorogermanate activated with Mn.

DETAILED DESCRIPTION

Figure 1:
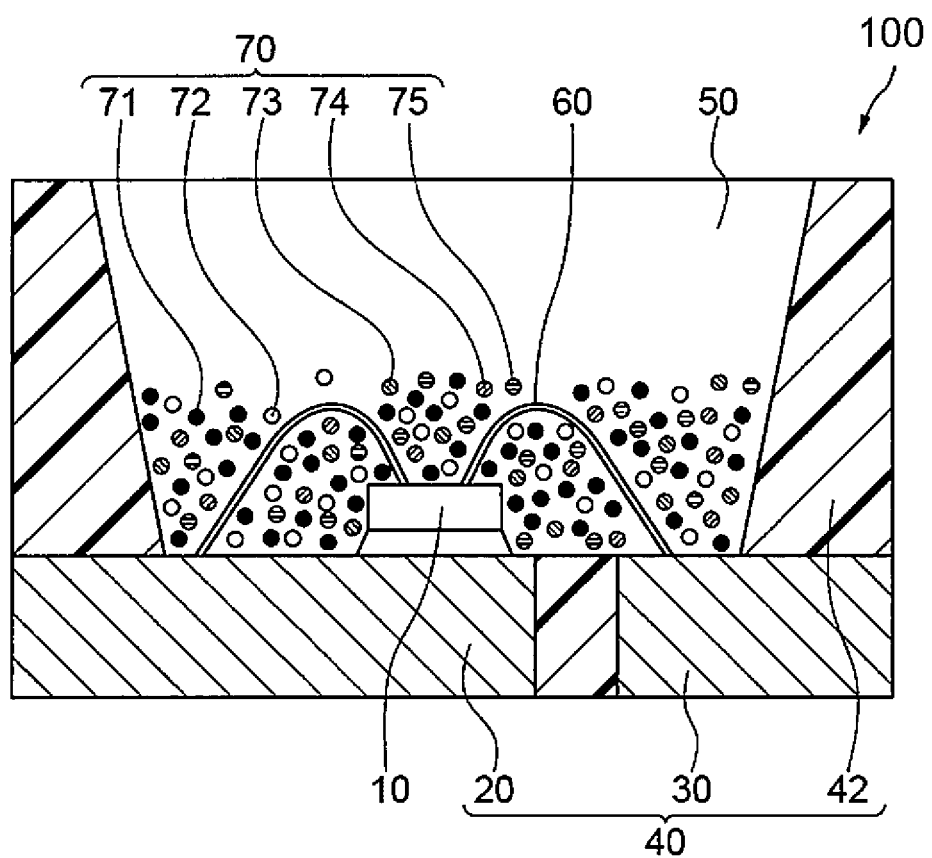
FIG. 1 is a schematic cross-sectional view showing an example of a light emitting device according to an embodiment of the present disclosure.

In conventional light emitting devices, reduction in the color differences in yellow, green, red, etc., has been obtained by the use of phosphors that can emit yellow light, green light, and red light, respectively. However, the emission intensity in a blue region that mainly depends on the light emitting element has been difficult to approximate to the corresponding reference light source to reduce the color difference in the blue region. Emission intensity in the blue region may be adjusted by, for example, the amounts of phosphors and/or addition of a diffusion agent, but satisfactory results have not yet been achieved. Generally, the special color rendering index R12 is greatly affected by the emission in the blue wavelength region, and a conventional light emitting device tends to result in a low value of R12. In order to obtain a light emitting device with high color rendering properties, the light emitting device is required to produce continuous emission spectrum over the whole range of visible wavelength, from violet to blue, green to yellow, and orange to red, similar to sunlight, to increase the value of R12.

Accordingly, a light emitting element having a peak emission wavelength in a near-ultraviolet region that does not involve the calculation of the color rendering index may be used in a light emitting device. However, light in the near-ultraviolet region not only affects humans and objects to be irradiated, but also deteriorates the components of the light emitting device and/or causes significant degradation in luminous efficiency of the light emitting device.

According to an embodiment of the present disclosure, a light emitting device of high color rendering properties can be provided.

Specific examples for achieving the objects will be described below. The present disclosure includes embodiments as described below. A light emitting device includes a light emitting element having a peak emission wavelength in a range of 410 nm to 440 nm and a phosphor member. The phosphor member includes a first phosphor having a peak emission wavelength in a range of 430 nm to 500 nm and containing an alkaline-earth phosphate that has Cl in the composition and activated with Eu, a second phosphor having a peak emission wavelength in a range of 440 nm to 550 nm and containing at least one of alkaline-earth aluminate activated with Eu, and silicate that has Ca, Mg, and Cl in the composition and activated with Eu, a third phosphor having a peak emission wavelength in a range of 500 nm to 600 nm and containing a rare-earth aluminate activated with Ce, a fourth phosphor having a peak emission wavelength in a range of 610 nm to 650 nm and containing a silicon nitride that has Al and at least one of Sr and Ca in the composition and activated with Eu, and a fifth phosphor having a peak emission wavelength in a range of 650 nm to 670 nm and containing a fluorogermanate activated with Mn.

According to an embodiment of the present disclosure, a light emitting device of high color rendering properties can be provided.

Preferred embodiments of the present disclosure will be described below with reference to the drawings. The preferred embodiments are intended as illustrative of light emitting devices to give concrete forms to technical ideas of the present invention, and the scope of the invention is not limited to those described below. The relation between the color names and the chromaticity coordinates, the relation between the range of wavelength of light and the color name of single color light, and the like conform to JIS Z8110. Further, the "content of each component in the composition" indicates that in the case where a plural number of substances corresponding to each component are present in the composition, refers to a total amount of the plural number of substances in the composition.

Light Emitting Device

FIG. 1 is a schematic cross-sectional view of a light emitting device 100 according to an embodiment of the present disclosure. The light emitting device 100 includes a light emitting element 10 having a peak emission wavelength in a range of 410 nm to 440 nm and a phosphor member 50. The phosphor member 50 contains a phosphor 70 that includes at least five types of phosphors: a first phosphor 71, a second phosphor 72, a third phosphor 73, a fourth phosphor 74, and a fifth phosphor 75. The first phosphor 71 has a peak emission wavelength in a range of 430 nm to 500 nm and contains an alkaline-earth phosphate that has Cl in the composition and activated with Eu. The second phosphor 72 has a peak emission wavelength in a range of 440 nm to 550 nm and contains at least one of alkaline-earth aluminate activated with Eu, and silicate that has Ca, Mg, and Cl in the composition and activated with Eu. The third phosphor 73 has a peak emission wavelength in a range of 500 nm to 600 nm and contains a rare-earth aluminate activated with Ce. The fourth phosphor 74 has a peak emission wavelength in a range of 610 nm to 650 nm and contains a silicon nitride that has Al and at least one of Sr and Ca in the composition and activated with Eu. The fifth phosphor 75 has a peak emission wavelength in a range of 650 nm to 670 nm and containing a fluorogermanate activated with Mn. Further, the phosphor 70 contained in the phosphor member 50 preferably include the first phosphor 71 with a content in a range of 20 mass % to 80 mass % with respect to a total amount of the phosphor 70.

With the light emitting element 10 having a specific emission wavelength and the phosphor member 50 that contains at least five types of specific phosphors with the phosphor 71 of a content of a specific range, an emission spectrum similar to that of corresponding reference light source can be produced by the light emitting device 100. Accordingly, high color rendering properties can be achieved. Also, with the use of the light emitting element 10 that has a peak emission wavelength in a specific wavelength range, safety as a light source and high luminous efficiency can be achieved. Further, with the use of certain light emitting element 10 and the phosphor member 50 containing the first phosphor 71 of certain content, particularly special color rendering index R12 can be improved.

The International Commission on Illumination (CIE) published, in 1986, a guide for the color rendering properties that fluorescent lamps are to provide. According to the guide, preferable average color rendering index Ra for the environments to illuminate is indicated, for example, Ra of 60 or more to less than 80 for general industrial work areas, etc., 80 or more to less than 90 for residences, hotels, restaurants, shops, offices, schools, hospitals, factories for precision work, etc., 90 or more for clinical examination, museums, etc., requiring high color rendering properties.

The light emitting device 100 has an Ra of 80 or greater, preferably 90 or greater, and more preferably 95 or greater. Also, the light emitting device 100 has special color rendering indices R9 to R15 of 50 or greater, preferably 70 or greater, and more preferably 90 or greater, respectively. In particular, R12 is, for example, 60 or greater, preferably 75 or greater, and more preferably 90 or greater. Further, a sum of special color rendering indices R9 to R15 (hereinafter may be referred to as Rt) is, for example, 570 or greater, preferably 600 or greater, and more preferably 650 or greater.

The light emitting device 100 emits light of mixed color of light emitted by a light emitting element 10 and fluorescent light emitted by the first phosphor 71, the second phosphor 72, the third phosphor 73, the fourth phosphor 74, and the fifth phosphor 75. For example, with respect to the chromaticity coordinates determined in CIE1931, the mixed light can be adjusted in a range of x=0.00 to 0.50 and y=0.00 to 0.50, and further in a range of x=0.25 to 0.40 and y=0.25 to 0.40. The correlated color temperature of light emitted by the light emitting device 100 may be, for example, 2,000K or greater or 2500K or greater. The correlated color temperature may be 7,500 K or less, or 7,000 K or less.

The light emitting device 100 will be described below with reference to FIG. 1. The light emitting device 100 is an example of a surface-mounted type light emitting device. The light emitting device 100 includes a light emitting element 10 of gallium nitride-based compound semiconductor to emit short-wavelength visible light (for example, 380 nm to 485 nm) with a peak emission wavelength in a range of 410 nm to 440 nm, and a molded body 40 where the light emitting element 10 is mounted. The molded body 40 is formed by integrally molding a first lead 20 and a second lead 30 with a resin part 42. Alternatively, the molded body 40 may be formed by using a known method with the use of ceramics in place of the resin member 42. A recess defined by a bottom surface and one or more side surfaces is formed in the molded body 40 and the light emitting element 10 is mounted on the bottom surface defining the recess. The light emitting element 10 has positive and negative electrodes and which are electrically connected with the first lead 20 and the second lead 30 through the wires 60, respectively. The light emitting element 10 is covered by a phosphor member 50. For example, the phosphor member 50 contains at least five types of phosphor: a first phosphor 71, a second phosphor 72, a third phosphor 73, a fourth phosphor 74, and a fifth phosphor 75, as the phosphor 70 to convert wavelength of light from the light emitting element 10.

Light Emitting Element 10

The light emitting element 10 may have a peak emission wavelength in a range of 410 nm to 440 nm, and in view of luminous efficiency, in a range of 420 nm and 440 nm is preferable. The use of a light emitting element 10 that has a peak emission wavelength in the range shown above as an excitation light source allows for obtaining of a light emitting device 100 to emit light of mixed color of the light emitted from the light emitting element 10 and fluorescent light emitted from the phosphor 70. Further, light emitted from the light emitting element 10 to the outside can be used efficiently, so that loss of light emitted from the light emitting device 100 can be reduced, and the light emitting device 100 of high efficiency can be obtained. Further, the peak emission wavelength is at a longer wavelength side than the near-ultraviolet region and has small ultraviolet content, so that the light emitting device 100 can provide safety as a light source and high luminous efficiency.

The half band width of the emission spectrum of the light emitting element 10 can be 30 nm or less, for example. For the light emitting element 10, a semiconductor light emitting element such as an LED can be used. With the use of a semiconductor light emitting element as a light source, a light emitting device 100 having a high linearity of outputting to inputting in high efficiency and having high stability to mechanical impacts can be obtained. For example, a light emitting element for emitting blue light or greenlight, a nitride-based semiconductor ($In_XAl_YGa_{1-X-Y}N$, in which X and Y satisfy $0 \leq X$, $0 \leq Y$, and $X+Y \leq 1$) etc., can be used.

Phosphor Member 50

The phosphor member 50 can include for example, a phosphor 70 and a resin material. The phosphor member 50 includes a phosphor 70 that includes at least one first phosphor 71 to emit blue light, at least one second phosphor 72 to emit green light, at least one third phosphor 73 to emit yellow light, at least one fourth phosphor 74 to emit red light, and at least one fifth phosphor 75 to emit deep red light, respectively upon absorbing the light emitted from the light emitting element 10. The first phosphor 71 to the fifth phosphor 75 have different compositions from one another. The characteristics of the light emitting device 100 such as the luminous efficiency and the color rendering properties can be adjusted in a desired range by appropriately selecting the composition ratio of the first phosphor 71 to the fifth phosphor 75.

First Phosphor 71

The first phosphor 71 is a blue light emitting phosphor that has a peak emission wavelength in a range of 430 nm to 500 nm and contains an alkaline-earth phosphate that has Cl in the composition and activated with Eu. The first phosphor 71 preferably has a composition, for example, represented by formula (1) shown below, more preferably has a composition (1') shown below. With this, luminous characteristics of the first phosphor 71 described below can be relatively easily obtained.

$$(Ca,Sr,Ba)_5(PO_4)_3(Cl,Br):Eu \qquad (1)$$

$$Ca_5(PO_4)_3Cl:Eu \qquad (1')$$

The first phosphor 71 has a maximum excitation wavelength in a range of, for example, 360 nm to 440 nm, preferably in a range of 370 nm to 430 nm. The first phosphor 71 can be excited efficiently by the light of the peak emission wavelength range of the light emitting element 10 described above. The first phosphor 71 may have a peak emission wavelength in a range of, for example, 430 nm to 500 nm, and in view of luminous efficiency, in a range of 440 nm and 480 nm is preferable. Accordingly, in the emission spectrum of the light emitting device 100, particularly in the blue region, overlapping between the emission spectrum of the first phosphor 71 and the emission spectra of the light emitting element 10 and the second phosphor 72 can be reduced. Further, by the emission spectrum of the first phosphor 71 and the emission spectrum of the light emitting element 10, emission intensity in blue region of the light emitting device 100 that has been attributed solely to the light emitting element 10 can be easily made closer to corresponding reference light source, and thus, color rendering properties of the light emitting device 100 can be improved. The first phosphor 71 has a half value width of the emission spectrum, for example, in a range of 29 nm to 49 nm, preferably in a range of 34 nm to 44 nm. In such a range of half band widths, color purity can be improved and the emission spectrum in blue region can be made closer to corresponding reference light source, and the color rendering properties of the light emitting device 100 can be further improved.

For example, when the light emitting device 100 emits light of correlated color temperature in a range of 2,000K to 7,500K, the percentage content (i.e., amount of the first phosphor/total amount of the phosphors) of the first phosphor 71 with respect to the total content of the phosphors in the phosphor member 50 may be 20 mass % or greater, preferably 25 mass % or greater, more preferably 40 mass % or greater. The percentage content of the first phosphor 71 may be, for example, 80 mass % or less, preferably 75 mass % or less, more preferably 70 mass % or less. When the percentage content of the first phosphor 71 is in the range described above, the emission spectrum of the light emitting device 100 can be made much closer to the corresponding reference light source, so that the color rendering properties of the light emitting device 100 can be further improved.

For example, when the light emitting device 100 emits light of correlated color temperature in a range of 2,000K to 7,500K, the content ratio of the first phosphor 71 with respect to the third phosphor 73 (i.e., the first phosphor 71/the third phosphor 73) may be, for example, 0.3 to 7, preferably 0.5 to 6.5, more preferably 0.6 to 6, and further preferably 1.8 to 6. With the content ratio in the range as described above, the emission spectrum of the light emitting device 100 can be made much closer to the corresponding reference light source, so that the color rendering properties of the light emitting device 100 can be further improved.

In the emission spectrum of the light emitting device 100, with the wavelength on the horizontal axis and the relative intensity on the vertical axis, the ratio of the peak emission intensity of the first phosphor 71 relative to the peak emission intensity of the light emitting element 10 (peak emission intensity of first phosphor 71/peak emission intensity of light emitting element 10; hereinafter may also be referred simply to "peak emission intensity ratio") can be, for example, when the light emitting device 100 is configured to emit light of correlated color temperature in a range of 2,000 K to 7,500K, for example, in a range of 0.15 to 2, preferably in a range of 0.3 to 1.8, and more preferably in a range of 0.5 to 1.5. When the peak emission intensity ratio is in the range as described above, the emission spectrum of the light emitting device 100 can be made much closer to the corresponding reference light source, so that the color rendering properties of the light emitting device 100 can be further improved. The peak emission intensity ratio can be calculated such that, the maximum value of the emission intensity in a range of 410 nm to 440 nm is assumed as the peak emission intensity of the light emitting element 10, and the maximum value of the emission intensity in a range of 440 nm to 470 nm is assumed as the peak emission intensity of the first phosphor 71.

For example, when the light emitting device 100 emits light of correlated color temperature in a range of 5,500K to 7,500K, the percentage content of the first phosphor 71 may be, for example, 30 mass % or greater, preferably 35 mass % or greater, more preferably 45 mass % or greater. The percentage content of the first phosphor 71 may be, for example, 80 mass % or less, preferably 77 mass % or less, more preferably 75 mass % or less. With the content ratio in the range as described above, the emission spectrum of the light emitting device 100 can be made much closer to the corresponding reference light source, so that the color rendering properties of the light emitting device 100 can be further improved.

For example, when the light emitting device 100 emits light of correlated color temperature in a range of 5,500K to 7,500K, the content ratio of the first phosphor 71 with respect to the third phosphor 73 may be, for example, 0.9 to 6, preferably 1.5 to 5.9, more preferably 2.5 to 5.85. With the content ratio in the range as described above, the emission spectrum of the light emitting device 100 can be made much closer to the corresponding reference light source, so that the color rendering properties of the light emitting device 100 can be further improved.

For example, when the light emitting device 100 emits light of correlated color temperature in a range of 5,500K to 7,500K, the peak emission intensity ratio of the first phosphor 71 with respect to the light emitting element 10 may be, for example, 0.4 to 1.5, preferably 0.45 to 1.47, more preferably 0.70 to 1.44. When the peak emission intensity ratio is in the range as described above, the emission spectrum of the light emitting device 100 can be made much closer to the corresponding reference light source, so that the color rendering properties of the light emitting device 100 can be further improved.

For example, when the light emitting device 100 emits light having a correlated color temperature of 4,500K or more and less than 5,500K, the percentage content of the first phosphor 71 may be, for example, 30 mass % or greater, preferably 45 mass % or greater, more preferably 55 mass % or greater. The percentage content of the first phosphor 71 may be, for example, 80 mass % or less, preferably 78 mass % or less, more preferably 76 mass % or less. With the percentage content in the range as described above, the emission spectrum of the light emitting device 100 can be made much closer to the corresponding reference light source, so that the color rendering properties of the light emitting device 100 can be further improved.

For example, when the light emitting device 100 emits light having a correlated color temperature of 4,500K or more and less than 5,500K, the content ratio of the first phosphor 71 with respect to the third phosphor 73 may be, for example, 0.8 to 5.5, preferably 1.5 to 5.4, more preferably 2 to 5.35. With the content ratio in the range as described above, the emission spectrum of the light emitting device 100 can be made much closer to the corresponding reference light source, so that the color rendering properties of the light emitting device 100 can be further improved.

For example, when the light emitting device 100 emits light having a correlated color temperature of 4,500K or more and less than 5,500K, the peak emission intensity ratio of the first phosphor 71 with respect to the light emitting element 10 may be, for example, 0.4 to 1.5, preferably 0.5 to 1.45, more preferably 0.6 to 1.4. When the peak emission intensity ratio is in the range as described above, the emission spectrum of the light emitting device 100 can be made much closer to the corresponding reference light source, so that the color rendering properties of the light emitting device 100 can be further improved.

For example, when the light emitting device 100 emits light having a correlated color temperature of 3,500K or more and less than 4,500K, the percentage content of the first phosphor 71 may be, for example, 20 mass % or greater, preferably 50 mass % or greater, more preferably 55 mass % or greater. The percentage content of the first phosphor 71 may be, for example, 75 mass % or less, preferably 70 mass % or less, more preferably 64 mass % or less. With the percentage content in the range as described above, the emission spectrum of the light emitting device 100 can be made much closer to the corresponding reference light source, so that the color rendering properties of the light emitting device 100 can be further improved.

For example, when the light emitting device 100 emits light having a correlated color temperature of 3,500K or more and less than 4,500K, the content ratio of the first phosphor 71 with respect to the third phosphor 73 may be, for example, 0.6 to 4.2, preferably 1.8 to 4 more preferably 2.2 to 3.3. With the content ratio in the range as described above, the emission spectrum of the light emitting device 100 can be made much closer to the corresponding reference light source, so that the color rendering properties of the light emitting device 100 can be further improved.

For example, when the light emitting device 100 emits light having a correlated color temperature of 3,500K or more and less than 4,500K, the peak emission intensity ratio of the first phosphor 71 with respect to the light emitting element 10 may be, for example, 0.3 to 1.3, preferably 0.6 to 1.25, more preferably 0.8 to 1.1. When the peak emission intensity ratio is in the range as described above, the emission spectrum of the light emitting device 100 can be made much closer to the corresponding reference light source, so that the color rendering properties of the light emitting device 100 can be further improved.

For example, when the light emitting device 100 emits light having a correlated color temperature of 2,500K or more and less than 3,500K, the percentage content of the first phosphor 71 may be 30 mass % or greater, preferably 35 mass % or greater, more preferably 40 mass % or greater. The percentage content of the first phosphor 71 may be, for example, 65 mass % or less, preferably 60 mass % or less, more preferably 55 mass % or less. With the percentage content in the range as described above, the emission spectrum of the light emitting device 100 can be made much closer to the corresponding reference light source, so that the color rendering properties of the light emitting device 100 can be further improved.

For example, when the light emitting device 100 emits light having a correlated color temperature of 2,500K or more and less than 3,500K, the content ratio of the first phosphor 71 with respect to the third phosphor 73 may be, for example, 1 to 4, preferably 1.5 to 3.5, more preferably 1.7 to 2.7. With the content ratio in the range as described above, the emission spectrum of the light emitting device 100 can be made much closer to the corresponding reference light source, so that the color rendering properties of the light emitting device 100 can be further improved.

For example, when the light emitting device 100 emits light having a correlated color temperature of 2,500K or more and less than 3,500K, the peak emission intensity of the first phosphor 71 with respect to the light emitting element 10 may be, for example, 0.2 to 1.4, preferably 0.5 to 1.2, more preferably 0.7 to 1.1. When the peak emission intensity ratio is in the range as described above, the emission spectrum of the light emitting device 100 can be made much closer to the corresponding reference light source, so that the color rendering properties of the light emitting device 100 can be further improved.

Second Phosphor 72

The second phosphor 72 is a green light emitting phosphor that has a peak emission wavelength in a range of 440 nm to 550 nm and contains at least one of either an alkaline-earth aluminate activated with Eu or a silicate that has Ca, Mg, and Cl in the composition and activated with Eu. The second phosphor 72 preferably includes at least an alkaline-earth aluminate described above. The alkaline-earth aluminate preferably has a composition, for example, represented by formula (2a) shown below, more preferably has a composition (2a') shown below. The silicate preferably has a composition, for example, represented by formula (2b) shown below, more preferably has a composition (2b') shown below. With this, luminous characteristics of the second phosphor 72 described below can be relatively easily obtained.

$$(Sr,Ca,Ba)_4Al_{14}O_{25}:Eu \qquad (2a)$$

$$Sr_4Al_{14}O_{25}:Eu \qquad (2a')$$

$$(Ca,Sr,Ba)_8MgSi_4O_{16}(F,Cl,Br)_2:Eu \qquad (2b)$$

$$Ca_8MgSi_4O_{16}Cl_2:Eu \qquad (2b')$$

When the second phosphor 72 has a content represented by the formula (2b), the second phosphor 72 contains at least one element selected from the group consisting of Ca, Sr, and Ba, in which at least Ca is preferably contained, and more preferably, a Ca content among Ca, Sr, and Ba, is 90 mol % or greater. The second phosphor 72 contains at least one element selected from the group consisting of F, Cl, and Br, in which at least Cl is preferably contained, more preferably, a Cl content among F, Cl, and Br, is 90 mol % or greater.

The second phosphor 72 has a maximum excitation wavelength in a range of, for example, 270 nm to 470 nm, preferably in a range of 370 nm to 460 nm. The second phosphor 72 can be excited efficiently by light which has a peak emission in the wavelength range of light emitting element 10 described above.

When the second phosphor 72 has a composition represented by the formula (2a), the peak emission wavelength may be, for example, in a range of 400 nm to 550 nm, preferably in a range of 460 nm and 530 nm. Also, a half value width of the emission spectrum may be, for example, in a range of 58 nm to 78 nm, preferably in a range of 63 nm to 73 nm.

When the second phosphor 72 has a composition represented by the formula (2b), the peak emission wavelength may be, for example, in a range of 510 nm to 540 nm, preferably in a range of 520 nm to 530 nm. Also, a half value width of the emission spectrum is, for example, in a range of 50 nm to 75 nm, preferably in a range of 58 nm to 68 nm.

With the use of at least one of such a second phosphor 72, color purity can be improved and the emission spectrum in the green region can be made closer to corresponding reference light, and the color rendering properties of the light emitting device 100 can be further improved.

For example, when the light emitting device 100 emits light of correlated color temperature in a range of 2,000K to 7,500K, the percentage content of the second phosphor 72 with respect to the total amount of the phosphors in the phosphor member 50 (i.e., amount of second phosphor/total amount of phosphors) may be 0.5 mass % or greater, preferably 0.7 mass % or greater, more preferably 1 mass % or greater. The percentage content of the second phosphor 72 may be 30 mass % or less, preferably 20 mass % or less, more preferably 15 mass % or less.

For example, when the light emitting device 100 emits light of correlated color temperature in a range of 5,500K to 7,500K, the percentage content of the second phosphor 72 may be 4 mass % or greater, preferably 5 mass % or greater, more preferably 6 mass % or greater. The percentage content of the second phosphor 72 may be, for example, 20 mass % or less, preferably 13 mass % or less, more preferably 11 mass % or less.

For example, when the light emitting device 100 emits light having a correlated color temperature of 4,500K or more and less than 5,500K, the percentage content of the second phosphor 72 may be, for example, 0.5 mass % or greater, preferably 0.7 mass % or greater, more preferably 1 mass % or greater. The percentage content of the second phosphor 72 may be, for example, 4 mass % or less, more preferably 3 mass % or less, more preferably 2 mass % or less.

For example, when the light emitting device 100 emits light of correlated color temperature of 3,500K or more and less than 4,500K, the percentage content of the second phosphor 72 may be, for example, 1.5 mass % or greater, preferably 2 mass % or greater, more preferably 2.2 mass % or greater. The percentage content of the second phosphor 72 may be, for example, 5 mass % or less, more preferably 3.5 mass % or less, more preferably 3 mass % or less.

For example, when the light emitting device 100 emits light of correlated color temperature of 2,500K or more and less than 3,500K, the percentage content of the second phosphor 72 may be, for example, 1.5 mass % or greater, preferably 2 mass % or greater, more preferably 2.2 mass % or greater. The percentage content of the second phosphor 72 may be, for example, 5 mass % or less, more preferably 3.5 mass % or less, more preferably 3 mass % or less.

When the percentage content of the second phosphor 72 is in one of the ranges described above, the emission spectrum of the light emitting device 100 in the green region can be made much closer to the corresponding reference light source, so that the color rendering properties of the light emitting device 100 can be further improved.

Third Phosphor 73

The third phosphor 73 is a yellow light emitting phosphor that has a peak emission wavelength in a range of 500 nm to 600 nm and contains a rare-earth aluminate activated with Ce. The third phosphor 73 preferably has a composition represented by formula (3) shown below, more preferably has a composition (3') shown below. With this, luminous characteristics of the third phosphor 73 described below can be relatively easily obtained.

$$(Y,Lu,Gd)_3(Al,Ga)_5O_{12}:Ce \quad (3)$$

$$Y_3Al_5O_{12}:Ce \quad (3')$$

The third phosphor 73 has a maximum excitation wavelength, for example, in a range of 220 nm to 490 nm, preferably in a range of 430 nm to 470 nm. The third phosphor 73 can be excited efficiently by the light of the peak emission wavelength range of the light emitting element 10 described above. The third phosphor 73 has a peak emission wavelength in a range of 480 nm to 630 nm, more preferably in a range of 500 nm to 560 nm. Accordingly, overlapping between the emission spectrum of the third phosphor 73 and the emission spectrum of the second phosphor 72 can be reduced, and a portion of the emission spectrum in the yellow region can be made closer to corresponding reference light, so that the color rendering properties of the light emitting device 100 can be further improved. The third phosphor 73 has a half value width of the emission spectrum, for example, in a range of 95 nm to 115 nm, preferably in a range of 100 nm to 110 nm. In such a range of half band widths, color purity can be improved and the emission spectrum in the yellow region can be made closer to corresponding reference light, so that the color rendering properties of the light emitting device 100 can be further improved.

For example, when the light emitting device 100 emits light of correlated color temperature in a range of 2,000K to 7,500K, the percentage content of the first phosphor 73 with respect to the total content of the phosphors in the phosphor member 50 (i.e., amount of the third phosphor/total amount of the phosphors) may be, for example, 8 mass % or greater, preferably 10 mass % or greater, more preferably 12 mass % or greater. The percentage content of the third phosphor 73 may be, for example, 40 mass % or less, preferably 30 mass % or less, more preferably 25 mass % or less.

For example, when the light emitting device 100 emits light of correlated color temperature in a range of 5,500K to 7,500K, the percentage content of the third phosphor 73 may be, for example, 8 mass % or greater, preferably 10 mass % or greater, more preferably 12 mass % or greater. The percentage content of the third phosphor 73 may be, for example, 40 mass % or less, preferably 30 mass % or less, more preferably 22 mass % or less.

For example, when the light emitting device 100 emits light of correlated color temperature 4,500K or more and less than 5,500K, the percentage content of the third phosphor 73 may be, for example, 10 mass % or greater, preferably 12 mass % or greater, more preferably 14 mass % or greater. The percentage content of the third phosphor 73 may be, for example, 45 mass % or less, preferably 30 mass % or less, more preferably 25 mass % or less.

For example, when the light emitting device 100 emits light of correlated color temperature 3,500K or more and less than 4,500K, the percentage content of the third phosphor 73 may be, for example, 10 mass % or greater, preferably 15 mass % or greater, more preferably 17.5 mass % or greater. The percentage content of the third phosphor 73 may be, for example, 50 mass % or less, preferably 35 mass % or less, more preferably 25 mass % or less.

For example, when the light emitting device 100 emits light of correlated color temperature 2,500K or more and less than 3,500K, the percentage content of the third phosphor 73 may be, for example, 15 mass % or greater, preferably 17.5 mass % or greater, more preferably 20 mass % or greater. The percentage content of the third phosphor 73 may be, for example, 40 mass % or less, preferably 30 mass % or less, more preferably 25 mass % or less.

When the percentage content of the third phosphor 73 is in one of the ranges described above, the emission spectrum in the yellow region of the light emitting device 100 can be made much closer to the corresponding reference light source, so that the color rendering properties of the light emitting device 100 can be further improved.

Fourth Phosphor 74

The fourth phosphor 74 is a red light emitting phosphor that has a peak emission wavelength in a range of 610 nm to 650 nm and contains a silicon nitride that has Al and at least one of Sr and Ca in the composition and activated with Eu. The fourth phosphor 74 preferably has a composition represented by formula (4) shown below. With this, luminous characteristics of the fourth phosphor 74 described below can be relatively easily obtained.

$$(Sr,Ca)AlSiN_3:Eu \quad (4)$$

When the fourth phosphor 74 has the content represented by the formula (4), the fourth phosphor 74 contains at least one element selected from the group consisting of Sr and Ca, in which both Sr and Ca are preferably contained, more preferably, of Sr and Ca, 0.8 mol % or greater Sr is contained. Accordingly, the peak emission wavelength of the fourth phosphor 74 can be made in a desired range.

The fourth phosphor 74 may have a peak emission wavelength in a range of 620 nm to 650 nm, preferably in a range of 630 nm and 645 nm. With the peak emission wavelength equal to or greater than the lower limit value shown above, insufficient emission intensity can be avoided between the peak emission wavelength of the fourth phosphor 74 and the peak emission wavelength of the fifth phosphor 75 to be described below, and a portion of the emission spectrum in the red region can be made closer to corresponding reference light. With the peak emission wavelength equal to or less than the upper limit value shown above, overlapping between the emission spectrum of the fourth phosphor 74 and the emission spectrum of the fifth phosphor 75 can be reduced, and effect of the emission spectrum of the fifth phosphor 75 can be efficiently obtained, and the color rendering properties of the light emitting device 100 can be further improved. The fourth phosphor 74 has a half value width of the emission spectrum, for example, in a range of 80 nm to 100 nm, preferably in a range of 85 nm to 95 nm. With the half band width in a range as described above, overlapping of the emission spectrum of the fourth phosphor 74 and the emission spectrum of the fifth phosphor 75 can be reduced, so that effect of the emission spectrum of the fifth phosphor 75 can be efficiently obtained, and the color rendering properties of the light emitting device 100 can be further improved.

For example, when the light emitting device 100 emits light of correlated color temperature in a range of 2,000K to 7,500K, the percentage content of the fourth phosphor 74 with respect to the total content of the phosphors in the phosphor member 50 (i.e., amount of the fourth phosphor 74/total amount of the phosphors) may be, for example, 0.5 mass % or greater, preferably 1 mass % or greater, more preferably 1.5 mass % or greater. The percentage content of the fourth phosphor 74 may be, for example, 6 mass % or less, preferably 5 mass % or less, more preferably 4 mass % or less.

For example, when the light emitting device 100 emits light of correlated color temperature in a range of 5,500K to 7,500K, the percentage content of the fourth phosphor 74 may be, for example, 1 mass % or greater, preferably 1.5 mass % or greater, more preferably 2 mass % or greater. The percentage content of the fourth phosphor 74 may be, for example, 6 mass % or less, preferably 4 mass % or less, more preferably 3.8 mass % or less.

For example, when the light emitting device 100 emits light of correlated color temperature 4,500K or more and less than 5,500K, the percentage content of the fourth phosphor 74 may be, for example, 0.5 mass % or greater, preferably 1 mass % or greater, more preferably 1.5 mass % or greater. The percentage content of the fourth phosphor 74 may be, for example, 3.5 mass % or less, preferably 3 mass % or less, more preferably 2.6 mass % or less.

For example, when the light emitting device 100 emits light of correlated color temperature 3,500K or more and less than 4,500K, the percentage content of the fourth phosphor 74 may be, for example, 1 mass % or greater, preferably 1.5 mass % or greater, more preferably 2.27 mass % or greater. The percentage content of the fourth phosphor 74 may be, for example, 4.8 mass % or less, preferably 3.5 mass % or less, more preferably 3 mass % or less.

For example, when the light emitting device 100 emits light of correlated color temperature 2,500K or more and less than 3,500K, the percentage content of the fourth phosphor 74 may be, for example, 2.5 mass % or greater, preferably 3 mass % or greater, more preferably 3.2 mass % or greater. The percentage content of the fourth phosphor 74 may be, for example, 4.5 mass % or less, preferably 4 mass % or less, more preferably 3.5 mass % or less.

When the percentage content of the fourth phosphor 74 is in one of the ranges described above, the emission spectrum in red range of the light emitting device 100 can be made much closer to the corresponding reference light source, so that the color rendering properties of the light emitting device 100 can be further improved.

Fifth Phosphor 75

The fifth phosphor 75 is a deep red light emitting phosphor that has a peak emission wavelength in a range of 650 nm to 670 nm and containing a fluorogermanate activated with Mn. The fifth phosphor 75 preferably has a composition at least one of fluorogermanates represented by formulas (5a) or (5b) shown below. The peak emission wavelengths of the phosphors represented by the formulas (5a) or (5b) are 650 nm or greater, which are longer than other red light emitting phosphors. Accordingly, the emission spectrum in a long wavelength region can be efficiently made closer to corresponding reference light, and the color rendering properties of the light emitting device 100 can be further improved.

$$3.5MgO.0.5MgF_2.GeO_2:Mn \quad (5a)$$

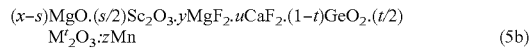

$$(x-s)MgO.(s/2)Sc_2O_3.yMgF_2.uCaF_2.(1-t)GeO_2.(t/2)M^t{}_2O_3:zMn \quad (5b)$$

In the formula (5b), x, y, z, s, t, and u respectively satisfy $2.0 \le x \le 4.0$, $0 < y < 1.5$, $0 < z < 0.05$, $0 \le s < 0.5$, $0 < t < 0.5$, and $0 \le u < 1.5$, and further, preferably satisfy $y+u < 1.5$. In the formula (5b), $M^t$ is at least one element selected from the group consisting of Al, Ga, and In.

In the formula (5b), $0.05 \le s < 0.3$ and $0.05 \le t < 0.3$ are preferably satisfied, with which the luminance can be further improved. The fifth phosphor 75 preferably has a composition represented by formula (5b') shown below. Accordingly, the fifth phosphor 75 can be excited efficiently by the light having a wavelength range that contains the peak emission wavelength of the light emitting element 10 described above.

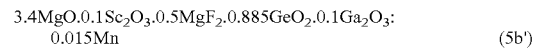

$$3.4MgO.0.1Sc_2O_3.0.5MgF_2.0.885GeO_2.0.1Ga_2O_3:0.015Mn \quad (5b')$$

The fifth phosphor 75 has a half value width of the emission spectrum, for example, 45 nm or less, preferably 40 nm or less. In such a range of half band widths, color purity can be improved and the emission spectrum in the red region can be made closer to corresponding reference light, and the color rendering properties of the light emitting device 100 can be further improved. Further, the fifth phosphor 75 preferably has an emission spectrum in which, when the maximum emission intensity is assumed 100%, average emission intensity in a range of 600 nm to 620 nm is, for example, 20% or less, preferably 10% or less. With the peak emission wavelength equal to or less than the upper limit value shown above, overlapping between the emission spectrum of the fifth phosphor 75 to be described below and the emission spectrum of the fourth phosphor 74 can be reduced, and effect of the emission spectrum of the fourth phosphor 74 can be efficiently obtained, and the color rendering properties of the light emitting device 100 can be further improved.

For example, when the light emitting device 100 emits light of correlated color temperature in a range of 2,000K to 7,500K, the percentage content of the fifth phosphor 75 with respect to the total content of the phosphors (i.e., amount of the fifth phosphor 75/total amount of the phosphors) in the phosphor member 50 may be, for example, 1 mass % or greater, preferably 2 mass % or greater, more preferably 3 mass % or greater. The percentage content of the fifth phosphor 75 may be, for example, 40 mass % or less, preferably 35 mass % or less, more preferably 30 mass % or less.

For example, when the light emitting device 100 emits light of correlated color temperature in a range of 5,500K to 7,500K, the percentage content of the fifth phosphor 75 may be, for example, 1 mass % or greater, preferably 2 mass % or greater, more preferably 3 mass % or greater. The percentage content of the fifth phosphor 75 may be, for example, 12 mass % or less, preferably 6 mass % or less, more preferably 5.5 mass % or less.

For example, when the light emitting device 100 emits light of correlated color temperature in a range of 4,500K or more and less than 5,500K, the percentage content of the fifth phosphor 75 may be, for example, 3 mass % or greater, preferably 5 mass % or greater, more preferably 7 mass % or greater. The percentage content of the fifth phosphor 75 may be, for example, 30 mass % or less, preferably 20 mass % or less, more preferably 15 mass % or less.

For example, when the light emitting device 100 emits light of correlated color temperature in a range of 3,500K or more and less than 4,500K, the percentage content of the first phosphor 75 may be, for example, 5 mass % or greater, preferably 8 mass % or greater, more preferably 10 mass % or greater. The percentage content of the fifth phosphor 75 may be, for example, 28 mass % or less, preferably 20 mass % or less, more preferably 16 mass % or less.

For example, when the light emitting device 100 emits light of correlated color temperature in a range of 2,500K or more and less than 3,500K, the percentage content of the first phosphor 75 may be, for example, 15 mass % or greater, preferably 18 mass % or greater, more preferably 20 mass % or greater. The percentage content of the fifth phosphor 75 may be, for example, 45 mass % or less, preferably 40 mass % or less, more preferably 30 mass % or less.

When the percentage content of the fifth phosphor 75 is in one of the ranges described above, the emission spectrum of the light emitting device 100 in the red region can be made much closer to the corresponding reference light source, so that the color rendering properties of the light emitting device 100 can be further improved.

The phosphor member 50 may optionally contain one or more phosphors other than the first phosphor 71 to the fifth phosphor 75. Examples of other phosphors include $Ca_3Sc_2Si_3O_{12}$:Ce, $CaSc_2O_4$:Ce, $(La,Y)_3Si_6N_{11}$:Ce, $(Ca,Sr,Ba)_3Si_6O_9N_4$:Eu, $(Ca,Sr,Ba)_3Si_6O_{12}N_2$:Eu, $(Ba,Sr,Ca)Si_2O_2N_2$:Eu, $(Ca, Sr, Ba)_2Si_5N_8$:Eu, $(Ca,Sr,Ba)S$:Eu, $(Ba,Sr,Ca)Ga_2S_4$:Eu, and $K_2(Si,Ti,Ge)F_6$:Mn. When the phosphor member 50 contains one or more other phosphors, the percent contents of those are appropriately adjusted to obtain the luminous characteristics that can be achieved according to the present disclosure. The percent contents of the one or more other phosphors with respect to the total amount of the phosphors may be, for example, 2 mass % or less, preferably 1 mass % or less.

Resin

Examples of the resin contained in the phosphor member 50 include thermoplastic resin and thermosetting resin. More specific examples of the thermosetting resin include epoxy resin, silicon resin, and modified silicone resin such as epoxy-modified silicon resin.

Other Components

The phosphor member 50 may optionally contain one or more components in addition to the phosphor 70 and the resin. Examples of such optional components include a filler material such as silica, barium titanate, titanium oxide, aluminum oxide, and an optical stabilizer, and a coloring agent. When the phosphor member 50 includes one or more other components, the contents thereof can be suitably set according to purpose and the like. For example, in the case of including a filler material as the other component, the content of the filler material can be in a range of 0.01 to 20 pts. by mass with respect to 100 pts. by mass of the resin.

EXAMPLES

Next, the present invention will be more specifically described with reference to examples, which however are not intended to limit the present invention.

Phosphor 70

Before producing the light emitting device 100, the first phosphor 71 to the fifth phosphor 75 described below were respectively provided.

For the first phosphor 71, a blue light emitting phosphor having a composition represented by $Ca_5(PO_4)_3Cl$:Eu and having a peak emission wavelength of about 460 nm (hereinafter may be referred to as "CCA") was provided.

For the second phosphor 72, a green light emitting phosphor having a composition represented by $Sr_4Al_{14}O_{25}$:Eu and having a peak emission wavelength of about 494 nm (hereinafter may be referred to as "SAE") was provided.

For the third phosphor 73, a rare earth-aluminum garnet phosphor having a composition represented by $Y_3Al_5O_{12}$:Ce and having a peak emission wavelength of about 544 nm (hereinafter may be referred to as "YAG") was provided.

For the fourth phosphor 74, a red light emitting phosphor having a composition represented by $(Sr, Ca)AlSiN_3$:Eu and having a peak emission wavelength of about 635 nm (hereinafter may be referred to as "SCASN") was provided.

For the fifth phosphor 75, a deep red light emitting phosphor having a composition represented by $3.4MgO \cdot 0.1Sc_2O_3 \cdot 0.5MgF_2 \cdot 0.885GeO_2 \cdot 0.1Ga_2O_3$: 0.015Mn and having a peak emission wavelength of about 658 nm (hereinafter may be referred to as "MGF") was provided.

Light Emitting Element 10

For a light emitting element 10, a blue-violet LED having a peak emission wavelength of 430 nm was provided.

Evaluation

Chromaticity coordinates of emission color, correlated color temperature (Tcp:K), average color rendering index (Ra), special color rendering indices (R9 to R15) of the light emitting devices 100 obtained in the Examples and Comparative Examples were measured. Further, a sum of special color rendering indices R9 to R15 (hereinafter may be referred to as Rt) was calculated. The average color rendering index and the special color indices may be collectively called "color rendering index". The emission spectrum of the light emitting device 100 was measured by using a light beam measuring apparatus equipped with an integral sphere.

Example 1

Producing Light Emitting Device 100

A light emitting device 100 was produced as described below, with the use of a combination of the light emitting element 10 for emitting blue-violet light having a peak emission wavelength of 430 nm, the first phosphor 71 (CCA), the second phosphor 72 (SAE), the third phosphor 73 (YAG), the fourth phosphor 74 (SCASN), and the fifth phosphor 75 (MGF).

A phosphor 70 containing the first phosphor 71 (CCA) with a percentage content of 33.3 mass % with respect to the total content of the phosphors, and other phosphors with percentage contents with respect to the total content of the phosphors as shown in Table 1, respectively, were combined to obtain a correlated color temperature of about 6,500 K. The phosphor 70 was added to silicone resin and was mixed and dispersed, and then further defoamed to obtain a phosphor-containing resin composition. The ratio of percentage contents of the first phosphor 71 with respect to the amount of the resin (i.e., first phosphor 71/resin) was 15%. Next, the phosphor-containing resin composition was injected to enclose the light emitting element 10, and heat was applied to harden the resin composition. Thus, Example 1 of the light emitting device 100 was produced.

Examples 2 to 7

Examples 2 to 7 of the light emitting device 100 were produced in a similar manner as in Example 1, except that contents of the phosphors were adjusted to satisfy the percentage contents shown in Table 1.

Comparative Example 1

Comparative Example 1 of the light emitting device 100 was produced in a similar manner as in Example 1, except that the first phosphor 71 (CCA) was not used and a combination of the second phosphor 72 (SAE), the third phosphor 73 (YAG), the fourth phosphor 74 (SCASN), and the fifth phosphor 75 (MGF) was used as the phosphor 70.

Examples 1 to 7, and Comparative Example 1 of the light emitting device 100 were evaluated and the evaluation results except for the color rendering indices are shown in Table 1, the results of the color rendering indices are shown in Table 2.

As shown in Table 1, the correlated color temperatures of Examples 1 to 7, and Comparative Example 1 are all in a range of 5,500 K to 7,500 K. In Examples 4, 5, 6, and 7, as shown in Table 1, the percentage contents of the first phosphor 71 with respect to the total content of the phosphors were respectively in a range of 60 mass % to 80 mass %, and the content ratios of the first phosphor 71 with respect to the content of the third phosphor 73 were respectively in a range of 2.5 to 6.0. As shown in Table 2, Examples 4, 5, 6, and 7 respectively show R12 of 90 or greater, and also Rt of 650 or greater, indicating particularly good color rendering properties.

TABLE 1

|  | Example 1 | Example 2 | Example 3 | Example 4 | Example 5 | Example 6 | Example 7 | Comparative Example 1 |
|---|---|---|---|---|---|---|---|---|
| First Phosphor Content (%) | 33.3 | 46.7 | 54.3 | 60.8 | 67.4 | 72.3 | 74.8 | — |
| Second Phosphor Content (%) | 17.3 | 14.0 | 12.0 | 10.3 | 8.4 | 7.1 | 6.5 | 26.3 |
| Third Phosphor Content (%) | 35.8 | 28.1 | 24.1 | 20.3 | 16.6 | 14.1 | 12.9 | 53.7 |
| Fourth Phosphor Content (%) | 4.6 | 4.6 | 3.9 | 3.6 | 2.9 | 2.5 | 2.3 | 7.6 |
| Fifth Phosphor Content (%) | 8.9 | 6.7 | 5.7 | 5.1 | 4.7 | 4.0 | 3.6 | 12.4 |
| First Phosphor/Resin(%) | 15 | 28 | 38 | 48 | 58 | 73 | 83 | — |
| First Phosphor/Third Phosphor | 0.93 | 1.66 | 2.25 | 2.99 | 4.06 | 5.11 | 5.81 | — |
| Emission Peak Intensity Ratio | 0.42 | 0.50 | 0.57 | 0.75 | 0.88 | 1.08 | 1.43 | — |
| Chromaticity x | 0.319 | 0.317 | 0.314 | 0.325 | 0.307 | 0.308 | 0.309 | 0.316 |
| Coordinates y | 0.312 | 0.336 | 0.335 | 0.346 | 0.320 | 0.326 | 0.331 | 0.328 |
| Correlated Color Temperature (K) | 6203 | 6226 | 6352 | 5779 | 6901 | 6754 | 6632 | 6317 |

TABLE 2

|  | Example 1 | Example 2 | Example 3 | Example 4 | Example 5 | Example 6 | Example 7 | Comparative Example 1 |
|---|---|---|---|---|---|---|---|---|
| Ra | 88 | 96 | 97 | 99 | 95 | 96 | 94 | 82 |
| R1 | 92 | 98 | 98 | 99 | 94 | 96 | 96 | 93 |
| R2 | 95 | 97 | 98 | 99 | 95 | 96 | 94 | 85 |
| R3 | 86 | 96 | 97 | 98 | 97 | 95 | 92 | 79 |
| R4 | 76 | 92 | 95 | 98 | 95 | 95 | 92 | 71 |
| R5 | 89 | 96 | 97 | 98 | 95 | 96 | 96 | 87 |
| R6 | 97 | 98 | 98 | 98 | 94 | 95 | 93 | 87 |
| R7 | 84 | 94 | 96 | 99 | 98 | 95 | 92 | 76 |
| R8 | 82 | 94 | 95 | 98 | 96 | 97 | 94 | 78 |
| R9 | 77 | 93 | 91 | 96 | 95 | 94 | 96 | 82 |
| R10 | 90 | 95 | 96 | 97 | 90 | 89 | 86 | 69 |
| R11 | 77 | 92 | 94 | 96 | 93 | 96 | 95 | 78 |
| R12 | 65 | 80 | 86 | 93 | 92 | 93 | 90 | 38 |
| R13 | 93 | 98 | 98 | 99 | 94 | 96 | 95 | 90 |
| R14 | 91 | 98 | 99 | 99 | 98 | 97 | 95 | 88 |
| R15 | 85 | 94 | 95 | 98 | 94 | 96 | 95 | 81 |
| Rt | 578 | 651 | 659 | 678 | 655 | 661 | 652 | 526 |

As shown in Tables 1 and 2, Examples 1 to 7 that contain the first phosphor 71 show greater values of Ra than Comparative Example 1 that does not contain the first phosphor 71. Moreover, Examples 1 to 7 show values of 60 or greater for all indices of R9 to R15. On the other hand, Comparative Example 1 that does not contain the first phosphor 71 shows smaller Ra than any Examples and R12 of 38 that is much smaller than Examples.

Figure 2:
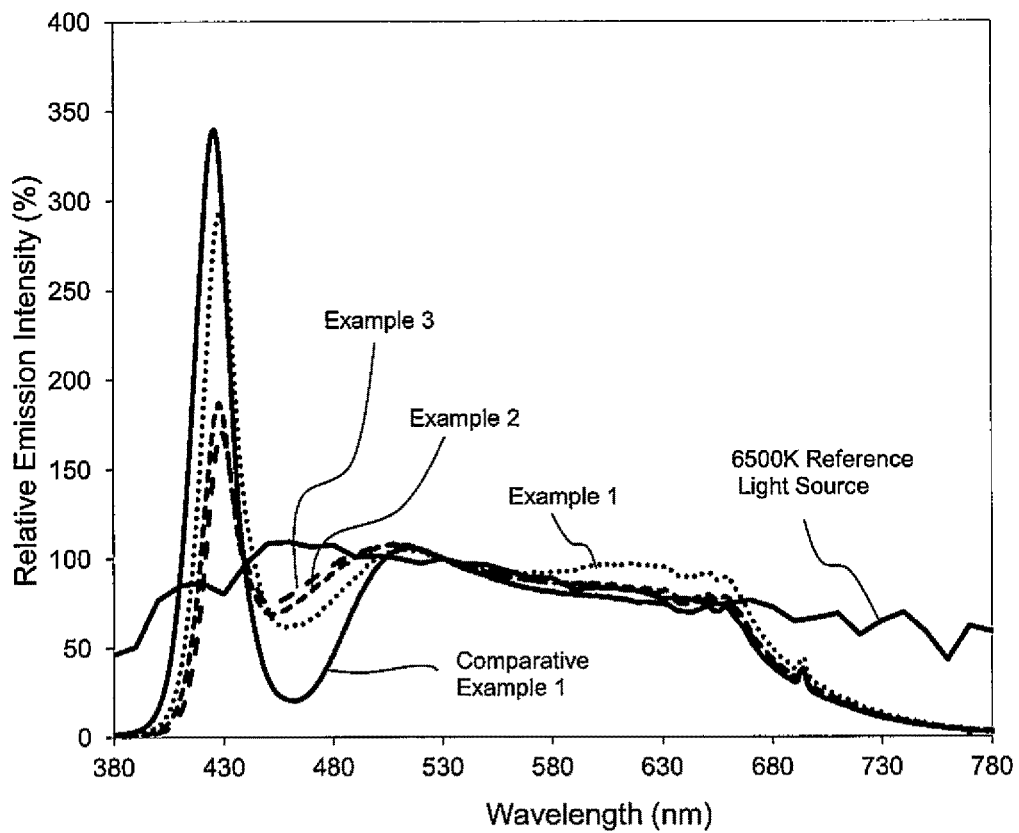
FIG. 2 is a diagram showing emission spectra of light emitting devices according to Examples 1 to 3 and Comparative Example 1.
Figure 3:
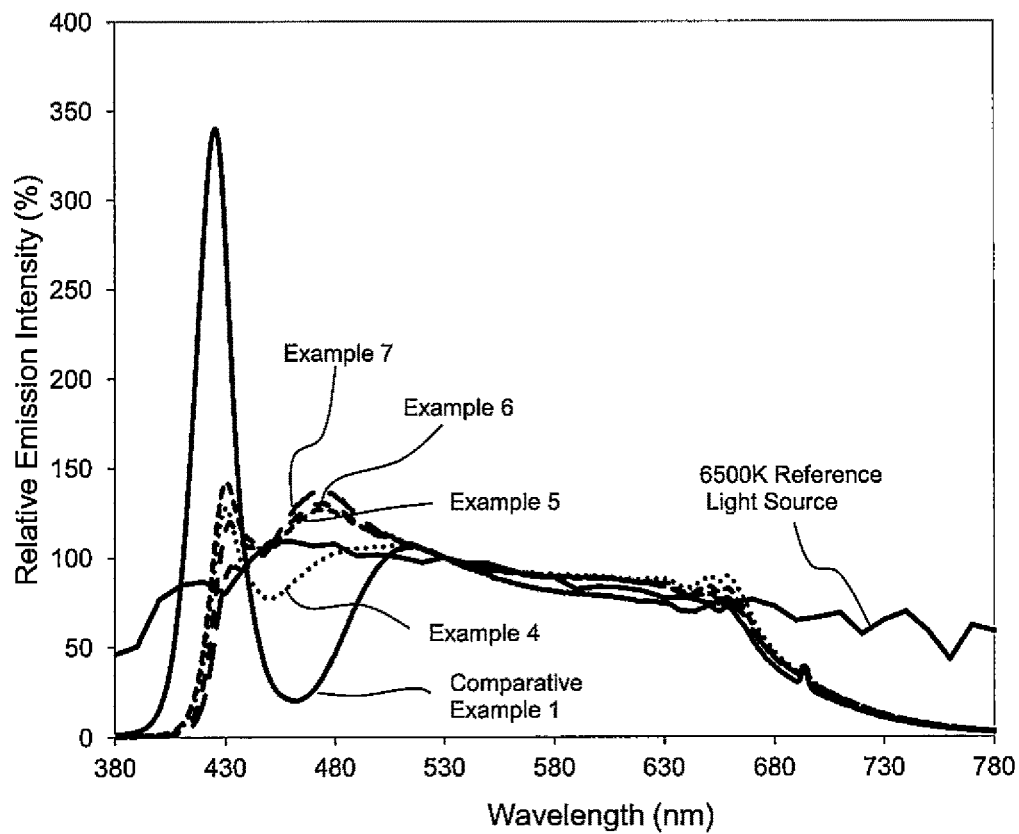
FIG. 3 is a diagram showing emission spectra of light emitting devices according to Examples 4 to 7 and Comparative Example 1.

FIG. 2 shows emission spectra of light emitting devices according to Comparative Example 1 and Examples 1 to 3, and FIG. 3 shows emission spectra of light emitting devices according to Comparative Example 1 and Examples 4 to 7, the emission spectra being normalized to the emission intensity at 530 nm of a 6,500K reference light source. The emission spectra shown in FIG. 2 and FIG. 3 show relative emission intensity versus wavelength. In Examples 4, 5, 6, and 7, as shown in Table 1, the intensity ratios of peak emission of the first phosphor 71 with respect to the light emitting element 10 in the emission spectra are respectively in a range of 0.7 to 1.5. As shown in Table 2, Examples 4, 5, 6, and 7 respectively show R12 of 90 or greater, and also Rt of 650 or greater, indicating particularly good color rendering properties.

Examples 8 to 15

Example 8 to 15 of the light emitting device 100 were produced in a similar manner as in Example 1, except that contents of the phosphors were adjusted to satisfy the ratios of contents shown in Table 3 to adjust the correlated color temperature to about 5,000K.

Comparative Example 2

Comparative Example 2 of the light emitting device 100 was produced in a similar manner as in Example 1, except that the first phosphor 71 (CCA) was not used and a combination of the second phosphor 72 (SAE), the third phosphor 73 (YAG), the fourth phosphor 74 (SCASN), and the fifth phosphor 75 (MGF) was used as the phosphor 70, and the correlated color temperature was adjusted to about 5,000 K.

Examples 8 to 15, and Comparative Example 2 of the light emitting device 100 were evaluated and the evaluation results except for the color rendering indices are shown in Table 3, the results of the color rendering indices are shown in Table 4.

TABLE 3

| | | Example 8 | Example 9 | Example 10 | Example 11 | Example 12 | Example 13 | Example 14 | Example 15 | Comparative Example 2 |
|---|---|---|---|---|---|---|---|---|---|---|
| First Phosphor Content (%) | | 33.9 | 50.6 | 58.1 | 62.5 | 66.0 | 70.2 | 71.9 | 75.5 | — |
| Second Phosphor Content (%) | | 3.2 | 2.4 | 2.0 | 1.8 | 1.6 | 1.4 | 1.4 | 1.2 | 4.9 |
| Third Phosphor Content (%) | | 39.4 | 29.1 | 23.4 | 20.8 | 18.9 | 16.5 | 16.2 | 14.2 | 60.6 |
| Fourth Phosphor Content (%) | | 3.1 | 2.7 | 2.5 | 2.4 | 2.2 | 1.9 | 1.8 | 1.6 | 3.9 |
| Fifth Phosphor Content (%) | | 20.3 | 15.2 | 14.0 | 12.5 | 11.3 | 9.9 | 8.6 | 7.5 | 30.7 |
| First Phosphor/ Resin(%) | | 20 | 40 | 50 | 60 | 70 | 85 | 100 | 120 | — |
| First Phosphor/ Third Phosphor | | 0.86 | 1.74 | 2.48 | 3.00 | 3.50 | 4.25 | 4.44 | 5.32 | — |
| Emission Peak Intensity Ratio | | 0.42 | 0.51 | 0.63 | 0.72 | 0.89 | 1.14 | 1.15 | 1.37 | — |
| Chromaticity | x | 0.340 | 0.352 | 0.343 | 0.345 | 0.350 | 0.349 | 0.354 | 0.346 | 0.344 |
| Coordinates | y | 0.351 | 0.352 | 0.345 | 0.348 | 0.355 | 0.357 | 0.362 | 0.358 | 0.354 |
| Correlated Color Temperature (K) | | 5150 | 4735 | 5018 | 4952 | 4815 | 4849 | 4675 | 4975 | 5006 |

TABLE 4

| | Example 8 | Example 9 | Example 10 | Example 11 | Example 12 | Example 13 | Example 14 | Example 15 | Comparative Example 2 |
|---|---|---|---|---|---|---|---|---|---|
| Ra  | 87  | 98  | 97  | 98  | 99  | 98  | 99  | 98  | 78  |
| R1  | 92  | 98  | 98  | 99  | 99  | 99  | 99  | 98  | 86  |
| R2  | 89  | 96  | 98  | 99  | 99  | 98  | 98  | 97  | 79  |
| R3  | 85  | 93  | 96  | 98  | 100 | 98  | 98  | 96  | 74  |
| R4  | 85  | 93  | 94  | 98  | 98  | 96  | 95  | 94  | 73  |
| R5  | 91  | 97  | 97  | 99  | 99  | 98  | 98  | 97  | 83  |
| R6  | 87  | 95  | 98  | 98  | 98  | 97  | 98  | 97  | 76  |
| R7  | 85  | 93  | 95  | 98  | 99  | 97  | 96  | 94  | 73  |
| R8  | 86  | 93  | 95  | 98  | 100 | 98  | 96  | 95  | 76  |
| R9  | 78  | 94  | 94  | 98  | 98  | 98  | 95  | 93  | 66  |
| R10 | 74  | 89  | 96  | 99  | 99  | 96  | 97  | 95  | 54  |
| R11 | 91  | 95  | 94  | 98  | 99  | 98  | 97  | 96  | 83  |
| R12 | 69  | 86  | 91  | 98  | 96  | 93  | 92  | 90  | 35  |
| R13 | 90  | 97  | 98  | 100 | 99  | 98  | 99  | 98  | 82  |
| R14 | 92  | 95  | 97  | 98  | 99  | 99  | 99  | 98  | 85  |
| R15 | 87  | 95  | 96  | 99  | 99  | 98  | 97  | 97  | 77  |
| Rt  | 580 | 652 | 666 | 689 | 689 | 679 | 675 | 666 | 482 |

As seen from Tables 3 and 4, Examples 8 to 15 that contain the first phosphor 71 show greater values of Ra than Comparative Example 2 that does not contain the first phosphor 71. Moreover, Examples 8 to 15 show values of 60 or greater for all indices of R9 to R15. On the other hand, Comparative Example 2 that does not contain the first phosphor 71 shows smaller Ra than any Examples and R12 of 35 that is much smaller than Examples.

As shown in Table 3, the correlated color temperatures of Examples 8 to 15, and Comparative Example 2 are all in a range of 4,500 K to 5,500 K. In Examples 10, 11, 12, 13, 14, and 15, as shown in Table 3, the percentage contents of the first phosphor 71 with respect to the total content of the phosphors were respectively in a range of 55 mass % to 80 mass %, and the content ratios of the first phosphor 71 with respect to the content of the third phosphor 73 were respectively in a range of 2.4 to 5.5. As shown in Table 4, Examples 10, 11, 12, 13, 14, and 15 respectively show R12 of 90 or greater, and also Rt of 660 or greater, indicating particularly good color rendering properties.

Figure 4:
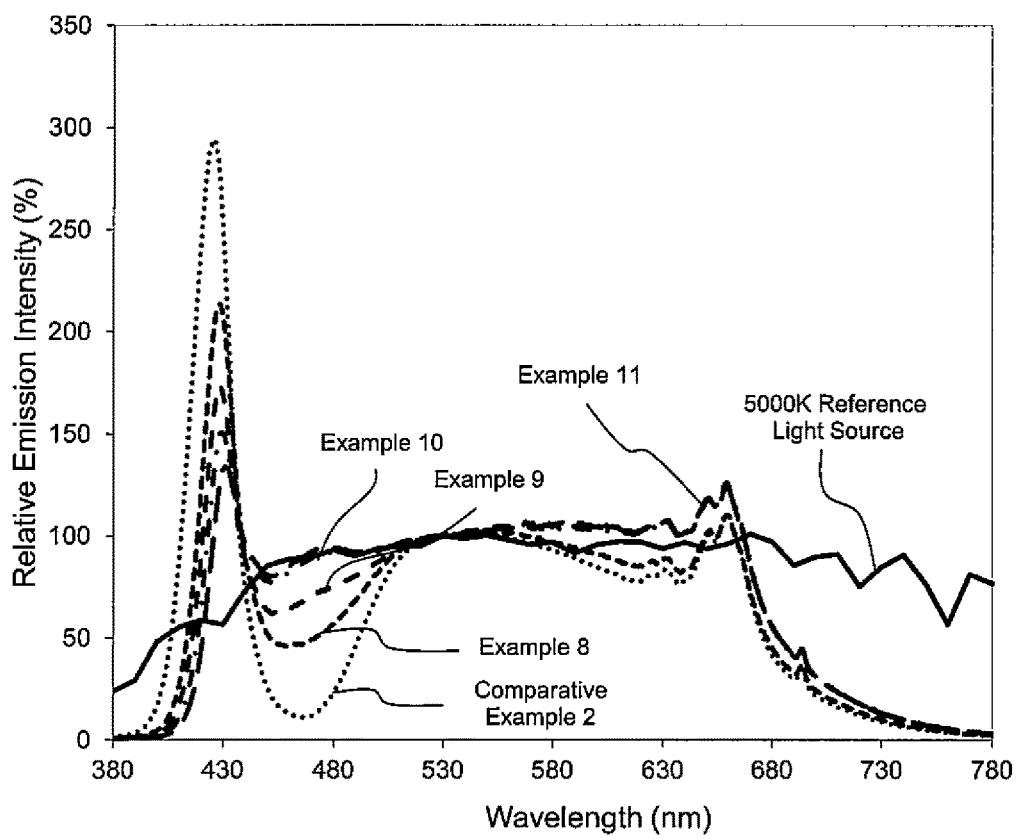
FIG. 4 is a diagram showing emission spectra of light emitting devices according to Examples 8 to 11 and Comparative Example 2.
Figure 5:
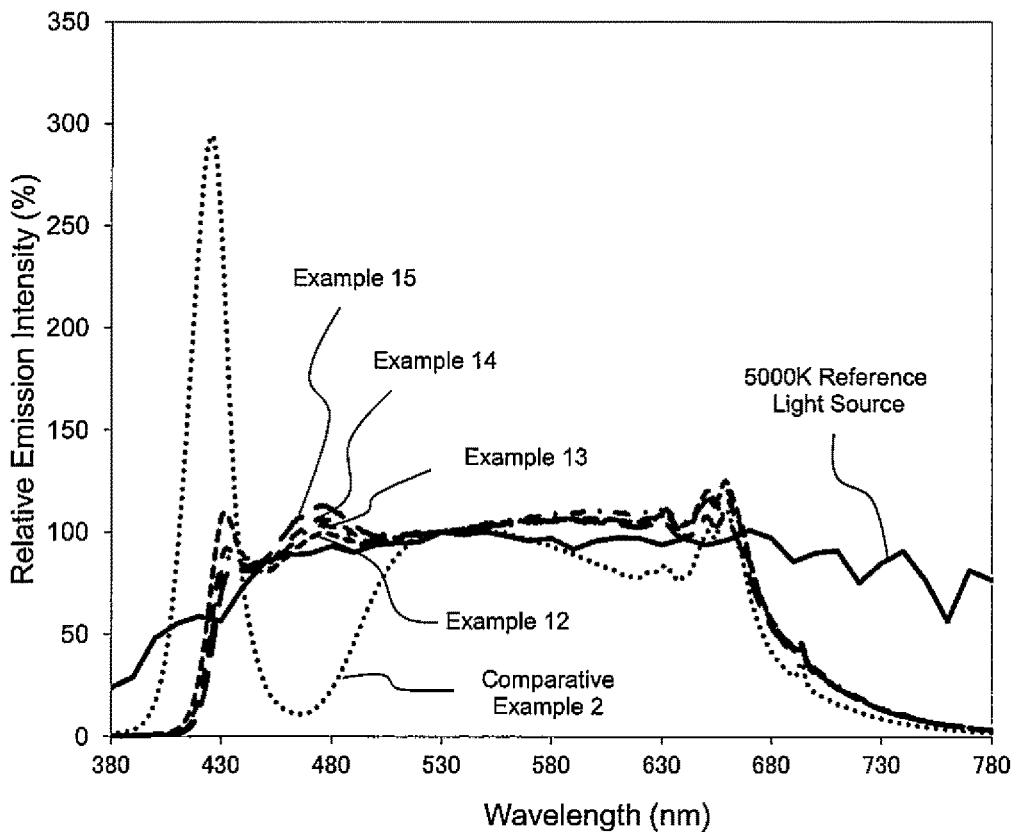
FIG. 5 is a diagram showing emission spectra of light emitting devices according to Examples 12 to 15 and Comparative Example 2.

FIG. 4 shows emission spectra of light emitting devices according to Comparative Example 2 and Examples 8 to 11, and FIG. 5 shows emission spectra of light emitting devices according to Comparative Example 2 and Examples 12 to 15, the emission spectra being normalized to the emission intensity at 530 nm of a 5,000K reference light source. The emission spectra shown in FIG. 4 and FIG. 5 respectively show relative emission intensity versus wavelength. In Examples 10, 11, 12, 13, 14, and 15, as shown in Table 3, the intensity ratios of peak emission of the first phosphor 71 with respect to the light emitting element 10 in the emission spectra are respectively in a range of 0.6 to 1.5. As shown in Table 4, Examples 10, 11, 12, 13, 14, and 15 respectively show R12 of 90 or greater, and also Rt of 660 or greater, indicating particularly good color rendering properties.

Examples 16 to 23

Examples 16 to 23 of the light emitting device 100 were produced in a similar manner as in Example 1, except that contents of the phosphors were adjusted to satisfy the percentage contents shown in Table 5 to adjust the correlated color temperature to about 4,000K.

Comparative Example 3

Comparative Example 3 of the light emitting device 100 was produced in a similar manner as in Example 1, except that the first phosphor 71 (CCA) was not used and a combination of the second phosphor 72 (SAE), the third phosphor 73 (YAG), the fourth phosphor 74 (SCASN), and the fifth phosphor 75 (MGF) was used as the phosphor 70, and the correlated color temperature was adjusted to about 4,000K.

Examples 16 to 23, and Comparative Example 3 of the light emitting device 100 were evaluated and the evaluation results except for the color rendering indices were shown in Table 5, the results of the color rendering indices were shown in Table 6.

TABLE 5

| | Example 16 | Example 17 | Example 18 | Example 19 | Example 20 | Example 21 | Example 22 | Example 23 | Comparative Example 3 |
|---|---|---|---|---|---|---|---|---|---|
| First Phosphor Content (%) | 24.6 | 39.5 | 52.1 | 56.6 | 60.3 | 62.0 | 66.0 | 68.3 | — |
| Second Phosphor Content (%) | 4.9 | 3.9 | 3.1 | 2.8 | 2.6 | 2.6 | 2.3 | 2.2 | 7.1 |
| Third Phosphor Content (%) | 39.7 | 31.7 | 25.1 | 22.7 | 20.8 | 20.5 | 18.3 | 17.3 | 59.3 |
| Fourth Phosphor Content (%) | 4.5 | 3.8 | 3.0 | 2.7 | 2.5 | 2.6 | 2.3 | 2.3 | 5.0 |
| Fifth Phosphor Content (%) | 26.2 | 21.1 | 16.7 | 15.1 | 13.8 | 12.4 | 11.1 | 9.9 | 28.6 |
| First Phosphor/Resin(%) | 15 | 30 | 50 | 60 | 70 | 80 | 95 | 100 | — |
| First Phosphor/Third Phosphor | 0.62 | 1.25 | 2.08 | 2.49 | 2.91 | 3.03 | 3.60 | 3.95 | — |
| Emission Peak Intensity Ratio | 0.38 | 0.51 | 0.70 | 0.83 | 1.01 | 1.03 | 1.20 | 1.17 | — |
| Chromaticity   x | 0.381 | 0.380 | 0.385 | 0.380 | 0.377 | 0.384 | 0.384 | 0.377 | 0.390 |
| Coordinates    y | 0.360 | 0.364 | 0.378 | 0.379 | 0.378 | 0.385 | 0.384 | 0.381 | 0.390 |
| Correlated Color Temperature (K) | 3819 | 3885 | 3875 | 3999 | 4074 | 3945 | 3947 | 4089 | 3825 |

TABLE 6

| | Example 16 | Example 17 | Example 18 | Example 19 | Example 20 | Example 21 | Example 22 | Example 23 | Comparative Example 3 |
|---|---|---|---|---|---|---|---|---|---|
| Ra | 91 | 94 | 98 | 99 | 99 | 98 | 99 | 98 | 84 |
| R1 | 97 | 97 | 99 | 99 | 100 | 99 | 99 | 98 | 90 |
| R2 | 95 | 97 | 99 | 99 | 99 | 99 | 99 | 99 | 85 |
| R3 | 88 | 92 | 97 | 98 | 99 | 99 | 98 | 98 | 81 |
| R4 | 84 | 89 | 97 | 98 | 98 | 98 | 97 | 96 | 82 |
| R5 | 93 | 95 | 98 | 99 | 99 | 99 | 98 | 98 | 87 |
| R6 | 95 | 98 | 99 | 99 | 99 | 99 | 98 | 99 | 82 |
| R7 | 87 | 92 | 98 | 99 | 98 | 98 | 97 | 96 | 81 |
| R8 | 86 | 91 | 97 | 98 | 99 | 97 | 96 | 95 | 83 |
| R9 | 86 | 88 | 96 | 97 | 100 | 92 | 93 | 88 | 77 |
| R10 | 89 | 95 | 98 | 99 | 98 | 98 | 98 | 99 | 68 |

TABLE 6-continued

|  | Example 16 | Example 17 | Example 18 | Example 19 | Example 20 | Example 21 | Example 22 | Example 23 | Comparative Example 3 |
|---|---|---|---|---|---|---|---|---|---|
| R11 | 86 | 90 | 96 | 97 | 98 | 98 | 98 | 97 | 88 |
| R12 | 69 | 82 | 93 | 98 | 97 | 97 | 95 | 94 | 44 |
| R13 | 98 | 98 | 99 | 99 | 99 | 99 | 99 | 99 | 87 |
| R14 | 92 | 95 | 98 | 99 | 99 | 99 | 99 | 99 | 89 |
| R15 | 91 | 93 | 98 | 99 | 99 | 97 | 97 | 96 | 84 |
| Rt | 610 | 640 | 677 | 687 | 691 | 681 | 679 | 671 | 538 |

As seen from Tables 5 and 6, Examples 16 to 23 that contain the first phosphor 71 show greater values of Ra than Comparative Example 3 that does not contain the first phosphor 71. Moreover, Examples 16 to 23 show values of 60 or greater for all indices of R9 to R15. On the other hand, Comparative Example 3 that does not contain the first phosphor 71 shows smaller Ra than any Examples and R12 of 44 that is much smaller than Examples.

As shown in Table 5, the correlated color temperatures of Examples 16 to 23, and Comparative Example 3 are all in a range of 3,500 K to 4,500 K. In Examples 19, 20, 21, and 22, as shown in Table 5, the percentage contents of the first phosphor 71 with respect to the total content of the phosphors were respectively in a range of 55 mass % to 70 mass %, and the content ratios of the first phosphor 71 with respect to the content of the third phosphor 73 were respectively in a range of 2.4 to 3.8. As seen from Table 6, Examples 19, 20, 21, and 22 respectively show R12 of 90 or greater, and also Rt of 670 or greater, indicating particularly good color rendering properties.

Figure 6:
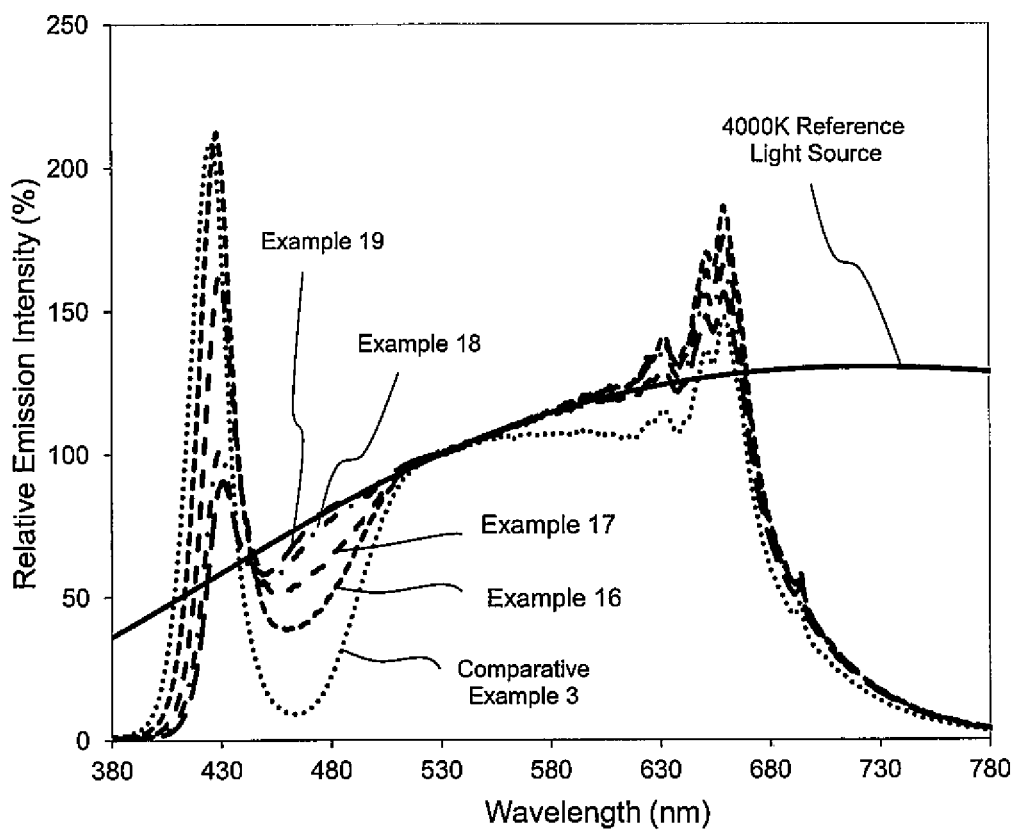
FIG. 6 is a diagram showing emission spectra of light emitting devices according to Examples 16 to 19 and Comparative Example 3.
Figure 7:
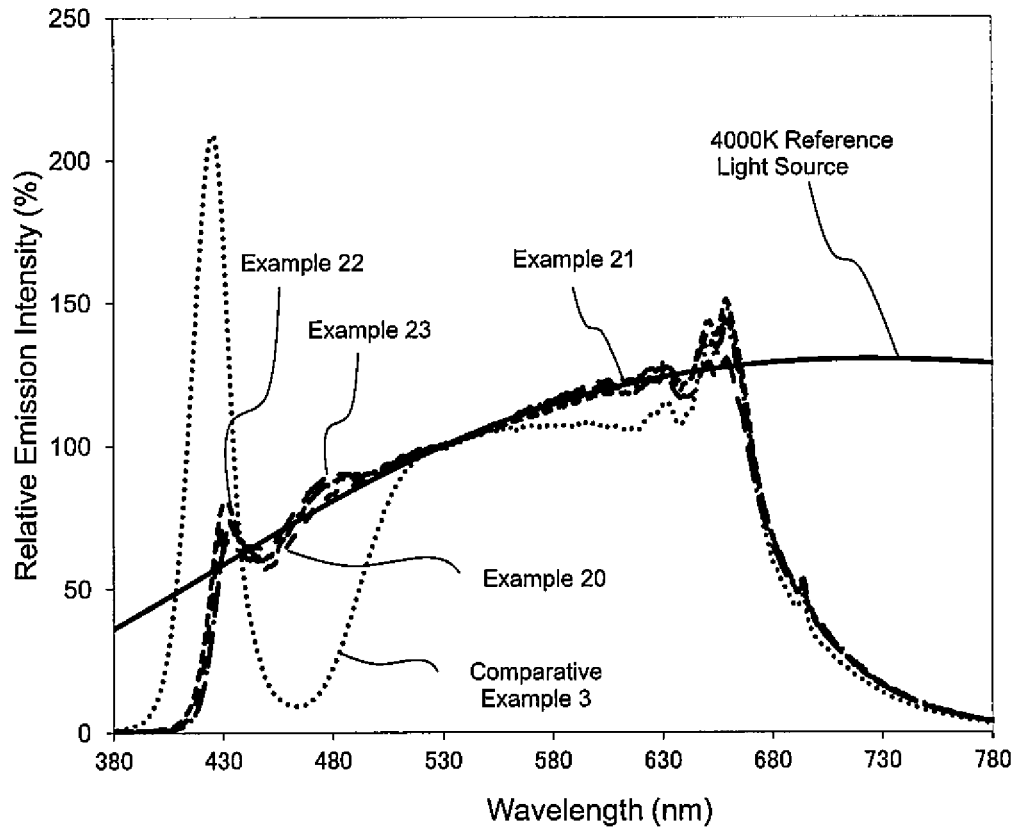
FIG. 7 is a diagram showing emission spectra of light emitting devices according to Examples 20 to 23 and Comparative Example 3.

FIG. 6 shows emission spectra of light emitting devices according to Comparative Example 3 and Examples 16 to 19, and FIG. 7 shows emission spectra of light emitting devices according to Comparative Example 3 and Examples 20 to 23, the emission spectra being normalized to the emission intensity at 530 nm of a 4,000K reference light source. The emission spectra shown in FIG. 6 and FIG. 7 respectively show relative emission intensity versus wavelength. In Examples 19, 20, and 21, as shown in Table 5, the intensity ratios of peak emission of the first phosphor 71 with respect to the light emitting element 10 in the emission spectra are respectively in a range of 0.8 to 1.1. As seen from Table 6, Examples 19, 20, and 21 respectively show R12 of 97 or greater, and also Rt of 680 or greater, indicating particularly good color rendering properties.

Example 24

Example 24 of the light emitting device 100 was produced in a similar manner as in Example 1, except that contents of the phosphors were adjusted to satisfy the ratios of contents shown in Table 7 to adjust the correlated color temperature to about 3000K.

Comparative Example 4

Comparative Example 4 of the light emitting device 100 was produced in a similar manner as in Example 1, except that the first phosphor 71 (CCA) was not used and a combination of the second phosphor 72 (SAE), the third phosphor 73 (YAG), the fourth phosphor 74 (SCASN), and the fifth phosphor 75 (MGF) was used as the phosphor 70, and the correlated color temperature was adjusted to about 3,000K.

Example 25

Example 25 of the light emitting device 100 was produced in a similar manner as in Example 1, except that contents of the phosphors were adjusted to satisfy the ratios of contents shown in Table 7 to adjust the correlated color temperature to about 2,700K.

Comparative Example 5

Comparative Example 5 of the light emitting device 100 was produced in a similar manner as in Example 1, except that the first phosphor 71 (CCA) was not used and a combination of the second phosphor 72 (SAE), the third phosphor 73 (YAG), the fourth phosphor 74 (SCASN), and the fifth phosphor 75 (MGF) was used as the phosphor 70, and the correlated color temperature was adjusted to about 2,700K.

Examples 24 and 25, and Comparative Examples 4 and 5 of the light emitting device 100 were evaluated and the evaluation results except for the color rendering indices were shown in Table 7, the results of the color rendering indices were shown in Table 8.

TABLE 7

|  | Example 24 | Comparative Example 4 | Example 25 | Comparative Example 5 |
|---|---|---|---|---|
| First Phosphor Content (%) | 51.9 | — | 44.2 | — |
| Second Phosphor Content (%) | 2.8 | 5.3 | 2.3 | 3.8 |
| Third Phosphor Content (%) | 21.7 | 42.7 | 22.5 | 38.8 |
| Fourth Phosphor Content (%) | 3.4 | 5.0 | 3.4 | 4.7 |
| Fifth Phosphor Content (%) | 20.1 | 47.0 | 27.6 | 52.6 |
| First Phosphor/Resin(%) | 80 | — | 80 | — |
| First Phosphor/Third Phosphor | 2.39 | — | 1.96 | — |
| Emission Peak Intensity Ratio | 0.95 | — | 0.95 | — |
| Chromaticity Coordinates x | 0.435 | 0.418 | 0.453 | 0.458 |
| Chromaticity Coordinates y | 0.404 | 0.369 | 0.413 | 0.397 |
| Correlated Color Temperature (K) | 3002 | 3011 | 2827 | 2611 |

TABLE 8

|  | Example 24 | Comparative Example 4 | Example 25 | Comparative Example 5 |
|---|---|---|---|---|
| Ra | 98 | 86 | 99 | 87 |
| R1 | 99 | 92 | 100 | 93 |
| R2 | 99 | 96 | 99 | 97 |
| R3 | 99 | 83 | 98 | 84 |

TABLE 8-continued

| | Example 24 | Comparative Example 4 | Example 25 | Comparative Example 5 |
|---|---|---|---|---|
| R4 | 98 | 76 | 98 | 80 |
| R5 | 98 | 88 | 99 | 90 |
| R6 | 97 | 95 | 99 | 95 |
| R7 | 99 | 80 | 99 | 83 |
| R8 | 99 | 74 | 99 | 75 |
| R9 | 100 | 57 | 100 | 59 |
| R10 | 97 | 91 | 99 | 94 |
| R11 | 95 | 76 | 96 | 78 |
| R12 | 92 | 51 | 95 | 59 |
| R13 | 98 | 95 | 100 | 95 |
| R14 | 99 | 89 | 98 | 90 |
| R15 | 99 | 83 | 99 | 86 |
| Rt | 680 | 543 | 687 | 562 |

As seen from Tables 7 and 8, Examples 24 and 25 that contain the first phosphor 71 show greater values of Ra than Comparative Examples 4 and 5 that do not contain the first phosphor 71. Moreover, Examples 24 and 25 show values of 90 or greater for all indices of R9 to R15. On the other hand, Comparative Example 4 that does not contain the first phosphor 71 shows smaller Ra than Example 24 and R12 of 51 that is much smaller than Example 24. On the other hand, Comparative Example 5 that does not contain the first phosphor 71 shows smaller Ra than Example 25 and R12 of 59 that is much smaller than Example 25.

As shown in Table 7, the correlated color temperatures of Examples 24 and 25, and Comparative Examples 4 and 5 are all in a range of 2,000 K to 3,500 K. In Examples 24 and 25, as shown in Table 7, the percentage contents of the first phosphor 71 with respect to the total content of the phosphors were respectively in a range of 40 mass % to 55 mass %, and the content ratios of the first phosphor 71 with respect to the content of the third phosphor 73 were respectively in a range of 1.9 to 2.5. As seen from Table 8, Examples 24 and 25 respectively show R12 of 90 or greater, and also Rt of 680 or greater, indicating greater color rendering properties than Comparative Examples 4 and 5.

Figure 8:
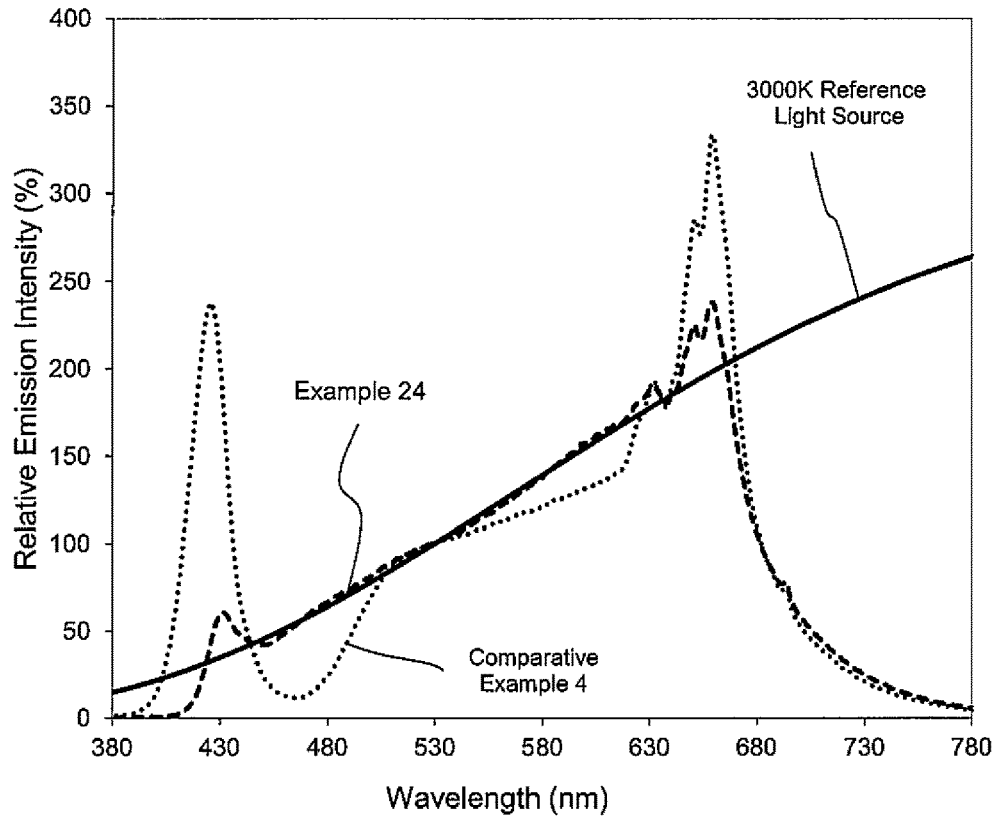
FIG. 8 is a diagram showing emission spectra of light emitting devices according to Example 24 and Comparative Example 4.
Figure 9:
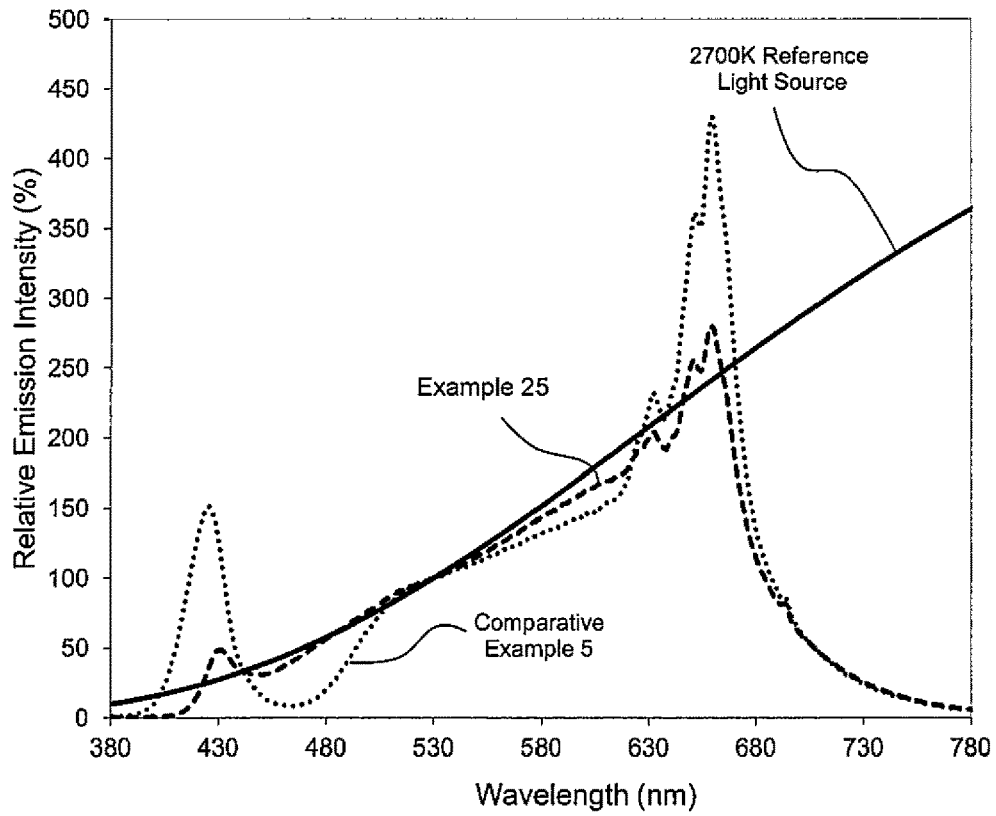
FIG. 9 is a diagram showing emission spectra of light emitting devices according to Example 25 and Comparative Example 5.

FIG. 8 shows emission spectra of light emitting devices according to Comparative Example 4 and Example 24, and FIG. 9 shows emission spectra of light emitting devices according to Comparative Example 5 and Example 25, the emission spectra being normalized to the emission intensity at 530 nm of a reference light source. The emission spectra shown in FIGS. 8 and 9 respectively show relative emission intensity versus wavelength. In Examples 24 and 25, as shown in Table 8, the peak emission intensity ratios in the emission spectra of the first phosphor 71 with respect to the light emitting element 10 are in a range of 0.8 to 1.1, respectively. In the Examples 24 and 25, as shown in Table 8, the values of R12 are 90 or greater, while the values of Rt are 680 or greater, which indicate greater color rendering properties than that in the Comparative Examples 4 and 5.

The light emitting devices according to certain embodiments can be used for lighting devices of good emission characteristics with an excitation light source of blue light emitting diode or ultraviolet light emitting diode, for LED displays, flash device for cameras, light source for liquid crystal displays, or the like. In particular, the light emitting devices according to certain embodiments can be used suitably to lighting devices and light sources that are required with high color rendering properties.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

Although the present disclosure has been described with reference to several exemplary embodiments, it is to be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

All publications, patent applications, and technical standards mentioned in this specification are herein incorporated by reference to the same extent as if each individual publication, patent application, or technical standard was specifically and individually indicated to be incorporated by reference.

What is claimed is:

1. A light emitting device comprising:
   a light emitting element having a peak emission wavelength in a range of 410 nm to 440 nm; and
   a phosphor member, the phosphor member containing a phosphor comprising:

a first phosphor having a peak emission wavelength in a range of 430 nm to 500 nm and having a half value width of a emission spectrum in a range of 29 nm to 49 nm;

a second phosphor having a peak emission wavelength in a range of 440 nm to 550 nm and having a half value width of a emission spectrum in a range of 58 nm to 78 nm or 50 nm to 75 nm;

a third phosphor having a peak emission wavelength in a range of 500 nm to 600 nm and having a half value width of a emission spectrum in a range of 95 nm to 115 nm;

a fourth phosphor having a peak emission wavelength in a range of 610 nm to 650 nm and having a half value width of a emission spectrum in a range of 80 nm to 100 nm; and a fifth phosphor having a peak emission wavelength in a range of 650 nm to 670 nm and having a half value width of a emission spectrum in a range of 45 nm or less, wherein a percentage content of the first phosphor to a total content of the phosphor is in a range of 20 mass % to 80 mass %, and wherein when the light emitting device is configured to emit light of correlated color temperature in a range of 5,500 K to 7,500 K, and a ratio of peak optical intensity of the first phosphor to the light emitting element is in a range of 0.4 to 1.5;

when the light emitting device is configured to emit light of correlated color temperature in a range of 4,500 K to 5,500 K, and a ratio of peak optical intensity of the first phosphor to the light emitting element is in a range of 0.4 to 1.5;

when the light emitting device is configured to emit light of correlated color temperature in a range of 3,500 K to 4,500 K, and a ratio of peak optical intensity of the first phosphor to the light emitting element is in a range of 0.3 to 1.3; and when the light emitting device is configured to emit light of correlated color temperature in a range of 2,500 K to 3,500 K, and a ratio of peak optical intensity of the first phosphor to the light emitting element is in a range of 0.2 to 1.4; and wherein the light emitting device is configured to emit light with a sum of special color rendering Indices R9 to R15 of 600 or greater.

2. The light emitting device according to claim 1, wherein the light emitting device is configured to emit light of correlated color temperature in a range of 5,500 K to 7,500 K, and a percentage content of the first phosphor with respect to a total content of the phosphor is in a range of 30 mass % to 80 mass %.

3. The light emitting device according to claim 2, wherein a content ratio of the first phosphor with respect to the third phosphor is in a range of 0.9 to 6.

4. The light emitting device according to claim 1, wherein the light emitting device is configured to emit light of correlated color temperature in a range of 4,500 K to less than 5,500 K, and a percentage content of the first phosphor with respect to a total content of the phosphor is in a range of 30 mass % to 80 mass %.

5. The light emitting device according to claim 4, wherein a content ratio of the first phosphor with respect to the third phosphor is in a range of 0.8 to 5.5.

6. The light emitting device according to claim 1, wherein the light emitting device is configured to emit light of correlated color temperature in a range of 3,500 K to less than 4,500 K, and a percentage content of the first phosphor with respect to a total content of the phosphor is in a range of 20 mass % to 75 mass %.

7. The light emitting device according to claim 6, wherein a content ratio of the first phosphor with respect to the third phosphor is in a range of 0.6 to 4.2.

8. The light emitting device according to claim 1, wherein the light emitting device is configured to emit light of correlated color temperature in a range of 2,500 K to less than 3,500 K, and a percentage content of the first phosphor with respect to a total content of the phosphor is in a range of 40 mass % to 55 mass %.

9. The light emitting device according to claim 8, wherein a content ratio of the first phosphor with respect to the third phosphor is in a range of 1.9 to 2.5.

10. The light emitting device according to claim 1, wherein the first phosphor contains an alkaline-earth phosphate, which includes Cl and is activated with Eu.

11. The light emitting device according to claim 10, wherein the alkaline-earth phosphate has a composition represented by formula (1):

$$(Ca,Sr,Ba)_5(PO_4)_3(Cl,Br):Eu \qquad (1).$$

12. The light emitting device according to claim 1, wherein the second phosphor contains at least one of an alkaline-earth aluminate, which is activated with Eu, and a silicate, which includes Ca, Mg, and Cl and is activated with Eu.

13. The light emitting device according to claim 12, wherein the alkaline-earth aluminate has a composition represented by formula (2a) and the silicate has a composition represented by formula (2b):

$$(Sr,Ca,Ba)_4Al_{14}O_{25}:Eu \qquad (2a)$$

$$(Ca,Sr,Ba)_8MgSi_4O_{16}(F,Cl,Br)_2:Eu \qquad (2b).$$

14. The light emitting device according to claim 1, wherein the third phosphor containing a rare-earth aluminate, which is activated with Ce.

15. The light emitting device according to claim 14, wherein the rare-earth aluminate has a composition represented by formula (3):

$$(Y,Lu,Gd)_3(Al,Ga)_5O_{12}:Ce \qquad (3).$$

16. The light emitting device according to claim 1, wherein the fourth phosphor contains a silicon nitride, which includes Al and at least one of Sr and Ca and is activated with Eu.

17. The light emitting device according to claim 16, wherein the silicon nitride has a composition represented by formula (4):

$$(Sr,Ca)AlSiN_3:Eu \qquad (4).$$

18. The light emitting device according to claim 1, wherein the fifth phosphor contains a fluorogermanate, which is activated with Mn.

19. The light emitting device according to claim 18, wherein the fluorogermanate has a composition represented by formula (5a) or formula (5b):

$$3.5MgO \cdot 0.5MgF_2 \cdot GeO_2:Mn \qquad (5a)$$

$$(x-s)MgO \cdot (s/2)Sc_2O_3 \cdot yMgF_2 \cdot cCaF_2 \cdot (1-t)GeO_2 \cdot (t/2)M^t_2O_3 \cdot zMn \qquad (5b)$$

wherein, $M^t$ is at least one selected from the group consisting of Al, Ga, and In, and x, y, z, s, t, and u respectively satisfy $2 \le x \le 4$, $0 < y < 1.5$, $0 < z < 0.05$, $0 \le s < 0.5$, $0 < t < 0.5$, and $0 \le u < 1.5$.

20. The light emitting device according to claim 1, wherein the light emitting device is configured to emit light with a special color rendering Index R12 of 60 or greater.

* * * * *